(12) United States Patent
Li et al.

(10) Patent No.: US 12,057,516 B2
(45) Date of Patent: Aug. 6, 2024

(54) ENERGY HARVEST AND STORAGE DEVICE FOR SEMICONDUCTOR CHIPS AND METHODS FOR FORMING THE SAME

(71) Applicant: Taiwan Semiconductor Manufacturing Company Limited, Hsinchu (TW)

(72) Inventors: Fu-Hai Li, Tainan (TW); Yi Ching Ong, Hsinchu (TW); Kuo-Ching Huang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 150 days.

(21) Appl. No.: 17/730,392

(22) Filed: Apr. 27, 2022

(65) Prior Publication Data
US 2023/0352612 A1    Nov. 2, 2023

(51) Int. Cl.
*H01L 31/07*  (2012.01)
*H01L 31/053*  (2014.01)
*H01L 31/18*  (2006.01)

(52) U.S. Cl.
CPC ............ *H01L 31/07* (2013.01); *H01L 31/053* (2014.12); *H01L 31/18* (2013.01)

(58) Field of Classification Search
CPC ........ H01L 31/07; H01L 31/053; H01L 31/18
See application file for complete search history.

(56) References Cited

U.S. PATENT DOCUMENTS

| | | | |
|---|---|---|---|
| 3,699,404 A * | 10/1972 | Simon | H01J 1/32 257/11 |
| 2012/0219831 A1* | 8/2012 | Mak | H10K 39/601 977/734 |
| 2016/0172365 A1* | 6/2016 | McKinnon | H10B 53/30 257/480 |
| 2022/0028571 A1* | 1/2022 | Downing | G21H 1/02 |
| 2022/0320297 A1* | 10/2022 | Hwang | H01L 29/401 |

* cited by examiner

*Primary Examiner* — Jayne L Mershon
(74) *Attorney, Agent, or Firm* — The Marbury Law Group, PLLC

(57) ABSTRACT

A semiconductor structure may include semiconductor devices located on a substrate, metal interconnect structures that are located within dielectric material layers overlying the semiconductor devices and are electrically connected to the semiconductor devices, and an energy harvesting device located over the metal interconnect structures and comprising a Schottky barrier diode, a first diode electrode located on a first side of the Schottky barrier diode, and a second diode electrode connected to a second side of the Schottky barrier diode.

20 Claims, 18 Drawing Sheets

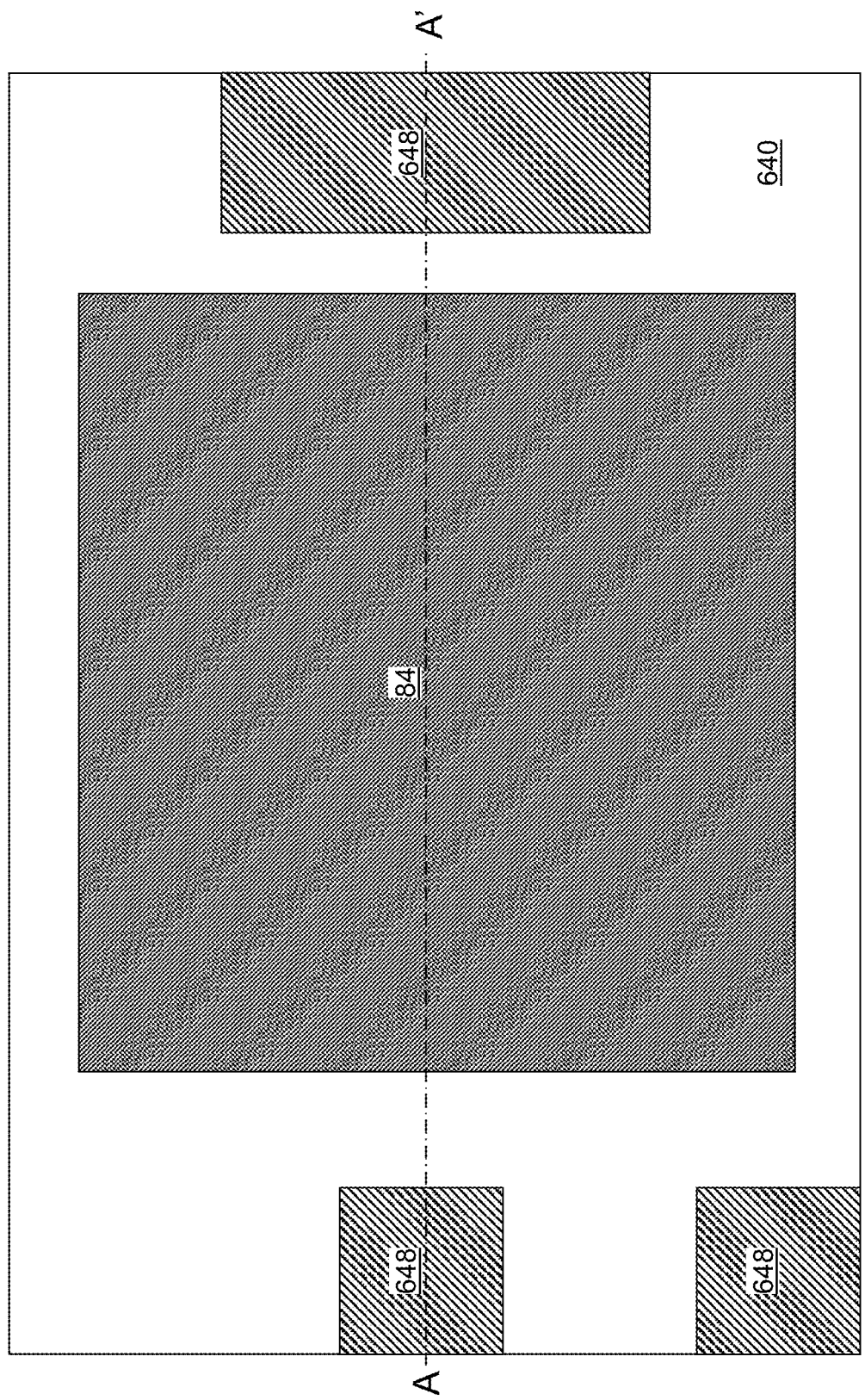

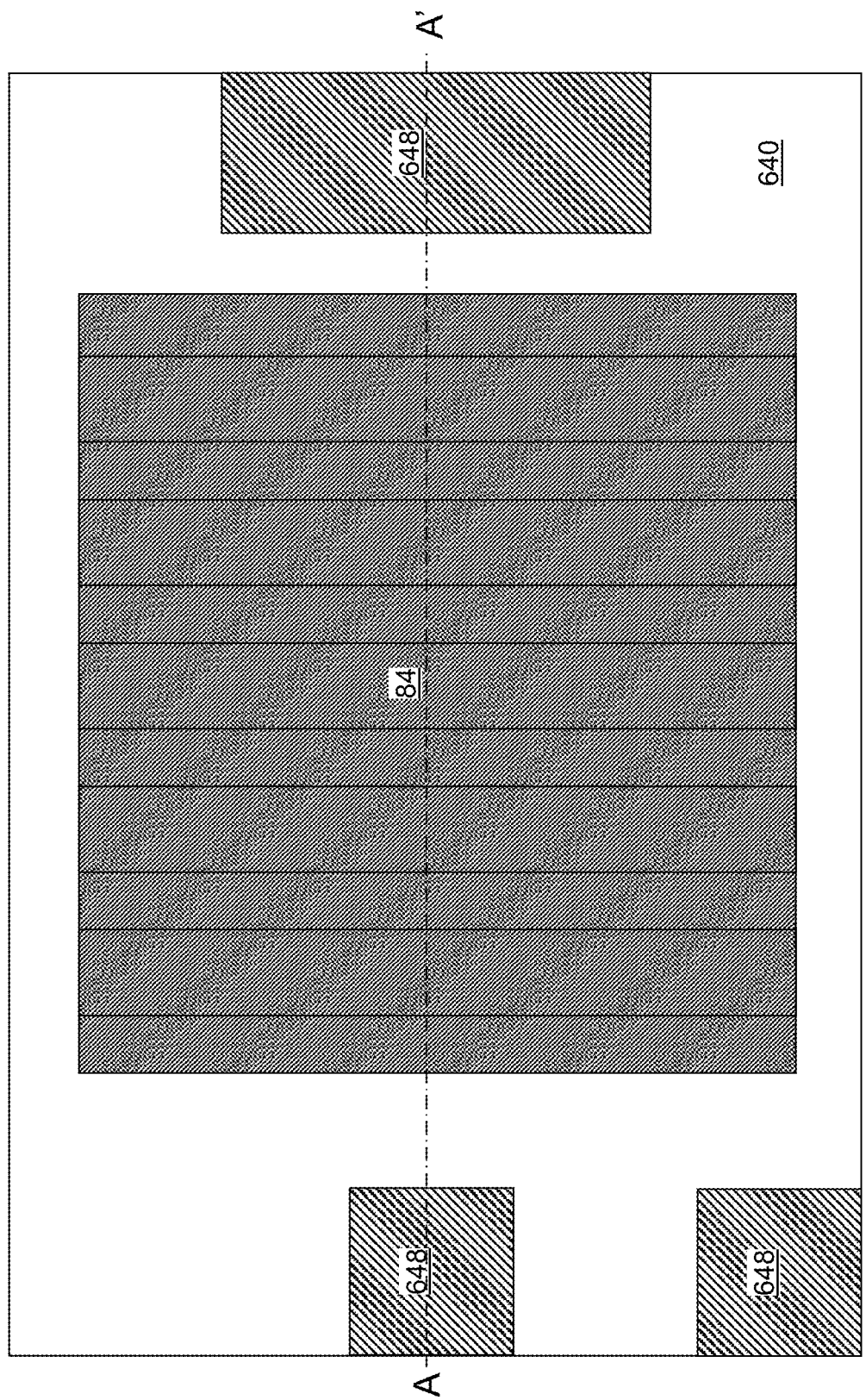

ENERGY HARVEST AND STORAGE DEVICE FOR SEMICONDUCTOR CHIPS AND METHODS FOR FORMING THE SAME

BACKGROUND

Operation of semiconductor devices in semiconductor dies generates a significant amount of heat, which is not used for any productive purposes and thus, is wasted. As semiconductor devices scale down in semiconductor dies, the power consumption in the semiconductor dies increases, and accordingly, the amount of wasted heat increases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a top-down view of the first exemplary structure of FIG. 2A. The vertical plane A-A' is the plane of the vertical cross-sectional view of FIG. 2A.

FIG. 6B is a top-down view of the third exemplary structure of FIG. 6A. The vertical plane A-A' is the plane of the vertical cross-sectional view of FIG. 6A.

DETAILED DESCRIPTION

Figure 1:
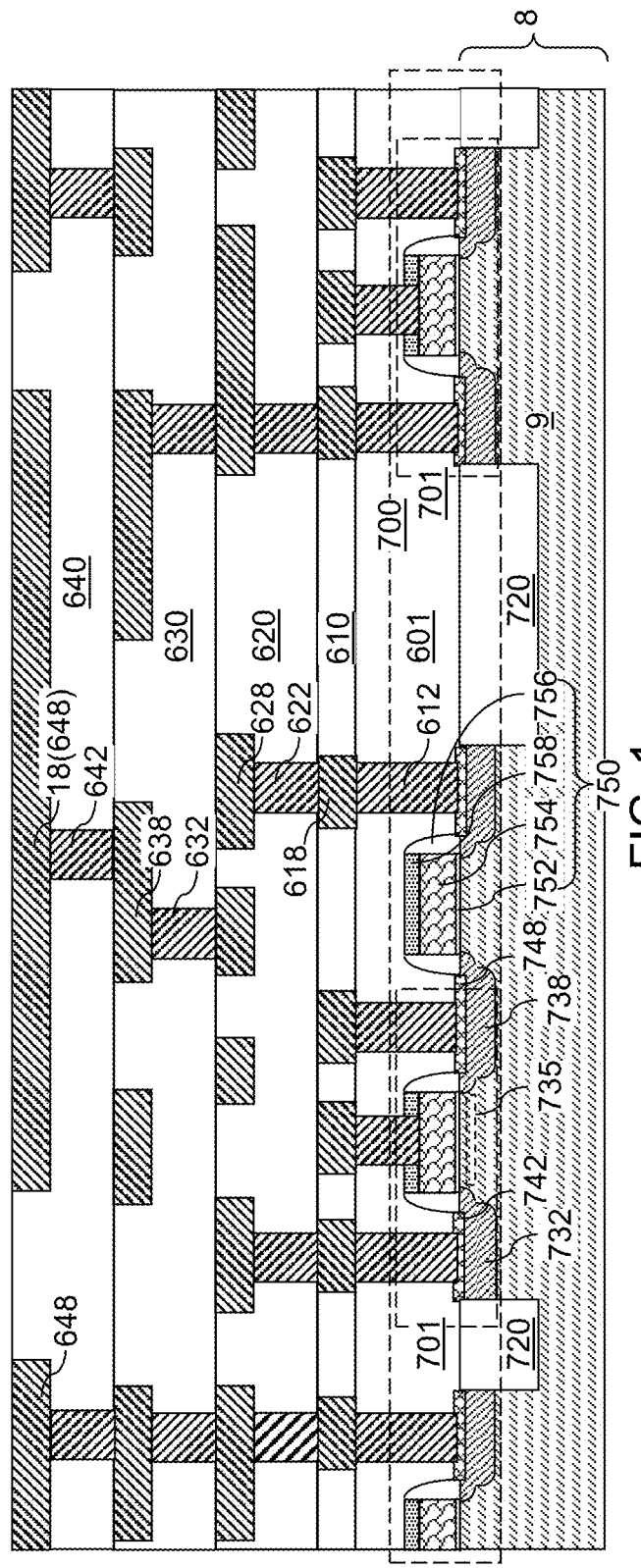
FIG. 1 is a vertical cross-sectional view of a first exemplary structure after formation of complementary metal-oxide-semiconductor (CMOS) transistors, metal interconnect structures, and dielectric material layers according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Various embodiments disclosed herein may be directed to energy harvesting devices with energy storage capability. Various embodiments of the energy harvesting devices may refer to devices that receive energy from the ambient in the form of infrared radiation and convert the received energy into electricity. In one embodiment, the infrared radiation may be generated during operation of semiconductor devices on a substrate, and the energy harvesting devices of various embodiments may be formed over the same substrate, for example, in a same semiconductor die, or on a different substrate such as in a semiconductor die that is proximal to another semiconductor die including the source of thermal radiation. In some embodiments, the thermal radiation from semiconductor devices may be generated during switching of transistors, and/or while transistors are turned on. In some embodiments, the energy harvesting devices may be formed as back-end-of-line (BEOL) structures over a first subset of metal interconnect structures in a semiconductor die, and a second subset of the metal interconnect structures in the semiconductor die may be used to provide electrical connection between the energy harvesting device and semiconductor devices within the same semiconductor die, or to another structure bonded to the semiconductor die. The various embodiments of the present disclosure are now described with reference to accompanying drawings.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738. The devices formed on the top surface of the semiconductor material layer 9 may include complementary metal-oxide-semiconductor (CMOS) transistors and optionally additional semiconductor devices (such as resistors, diodes, capacitor structures, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. In embodiments in which the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a subset of the field effect transistors 701 in the CMOS circuitry 700 may include a respective node that is subsequently electrically connected to a node of an energy harvesting device and/or to a battery structure to be subsequently formed.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, a second interconnect-level dielectric material layer 620, a third interconnect-level dielectric material layer 630, and a fourth interconnect-level dielectric material layer 640. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, second metal line structures 628 formed in an upper portion of the second interconnect-level dielectric material layer 620, second metal via structures 632 formed in a lower portion of the third interconnect-level dielectric material layer 630, third metal line structures 638 formed in an upper portion of the third interconnect-level dielectric material layer 630, third metal via structures 642 formed in a lower portion of the fourth interconnect-level dielectric material layer 640, and fourth metal line structures 648 formed in an upper portion of the fourth interconnect-level dielectric material layer 640. While the present disclosure is described using an embodiment in which four levels metal line structures are formed in dielectric material layers, embodiments are expressly contemplated herein in which a lesser or greater number of levels of metal line structures are formed in dielectric material layers.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. Generally, any contiguous set of a metal line structure (628, 638, 648) and at least one underlying metal via structure (622, 632, 642) may be formed as an integrated line and via structure. Generally, semiconductor devices may be formed on a substrate 8, and metal interconnect structures (612, 618, 622, 628, 632, 638, 642, 648) and dielectric material layers (601, 610, 620, 630, 640) over the semiconductor devices. The metal interconnect structures (612, 618, 622, 628, 632, 638, 642, 648) may be formed in the dielectric material layers (601, 610, 620, 630, 640), and may be electrically connected to the semiconductor devices.

According to an aspect of the present disclosure, a subset of the metal interconnect structures located at the topmost interconnect level may be configured to contact an electrode of a device to be subsequently formed. For example, a subset of the metal interconnect structures located at the topmost interconnect level may be configured to contact an electrode of a battery structure to be subsequently formed or to contact an electrode of an energy harvesting device to be subsequently formed. In the illustrated example, a subset of the fourth metal line structures 648 may be configured to contact a second electrode 18 of a battery structure to be subsequently formed. In some embodiments, the fourth metal line structures 648 may be integrally formed as and referred to as the second electrode 18 (648).

Figure 2A:
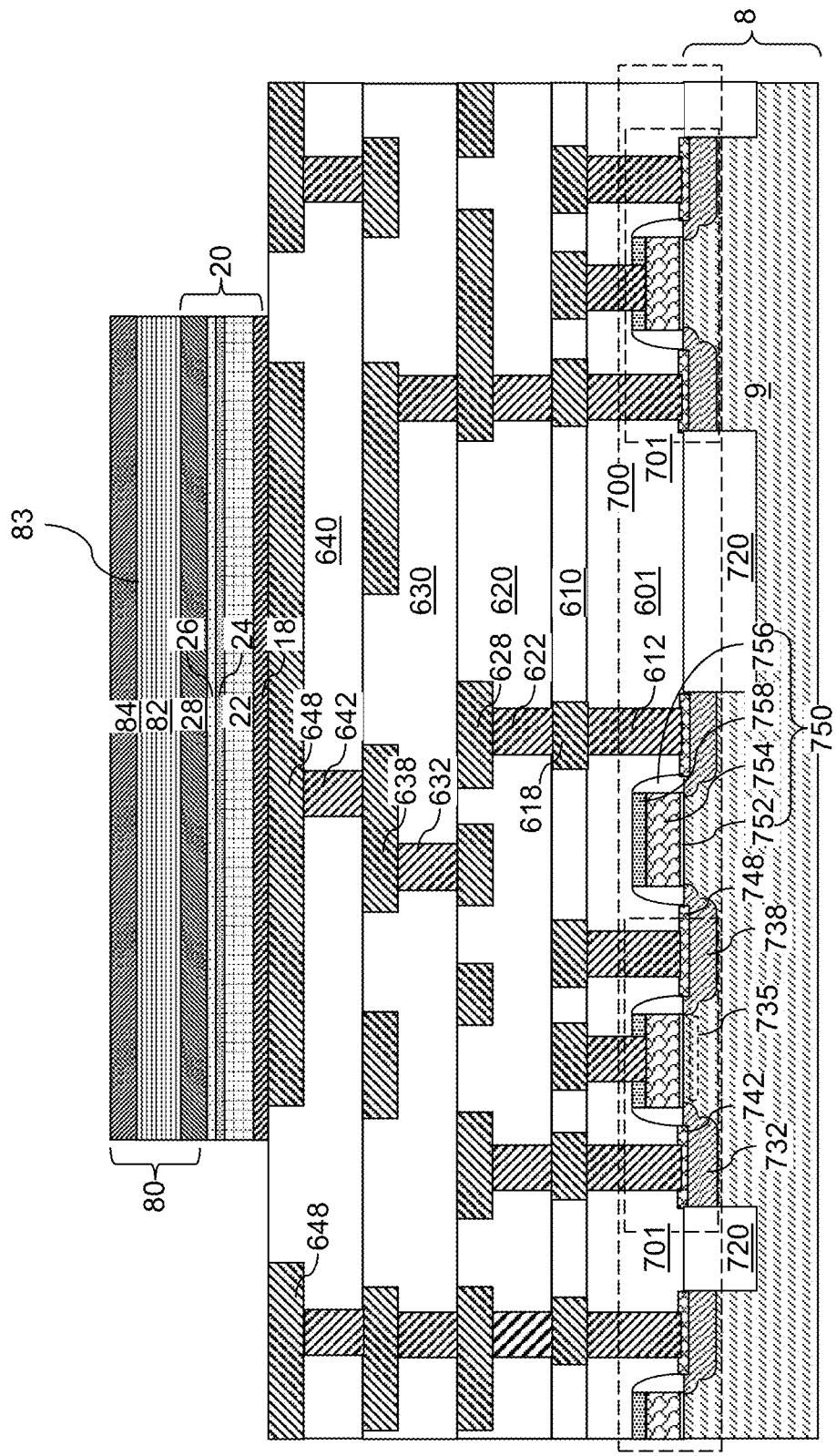
FIG. 2A is a vertical cross-sectional view of the first exemplary structure after formation of a stack of a battery structure and an energy harvesting device according to an embodiment of the present disclosure.

Referring to FIGS. 2A and 2B, a layer stack of material layers may be deposited over the second electrode 18, and may be subsequently patterned to form a stack of a battery structure 20 and an energy harvesting device 80. For example, the layer stack of material layers may include a second battery electrode material layer, an energy storage medium material layer, an optional blocking dielectric material layer, an optional conductive metal oxide material layer, a common electrode material layer, a compound semiconductor material layer, and a first diode electrode material layer which is a high work function material layer.

A photoresist layer (not shown) may be applied over the top surface of the layer stack of the deposited material layers, and may be lithographically patterned to cover at least one discrete area that overlies a respective underlying metal line structure (such as a respective fourth metal line structure 648). An etch process, such as an anisotropic etch process, may be performed to etch unmasked portions of the layer stack of the deposited material layers. The anisotropic etch process may include multiple anisotropic etch steps having different etch chemistries to etch through the various materials within the layer stack of the deposited material layers. Each patterned portion of the layer stack of the deposited material layers constitutes a vertical stack of a battery structure 20 and an energy harvesting device 80. The photoresist layer may be subsequently removed, for example, by ashing.

Each patterned portion of the second battery electrode material layer constitutes a second battery electrode 18. Each patterned portion of the energy storage medium material layer comprises an energy storage medium 22. Each patterned portion of the blocking dielectric material layer constitutes a blocking dielectric layer 24. Each patterned portion of the conductive metal oxide material layer constitutes a conductive metal oxide layer 26. Each patterned portion of the common electrode material layer constitutes a common electrode 28, which may be configured to operate as both a first battery electrode and a second diode electrode. Each patterned portion of the compound semiconductor material layer (as deposited in the layer stack) constitutes a compound semiconductor material plate 82. Each patterned portion of the first diode electrode material layer (which is a high work function material layer) constitutes a first diode electrode 84. A surface portion of the first diode electrode 84 in proximity to the compound semiconductor material plate 82 and a surface portion of the compound semiconductor material plate 82 that includes a depletion zone constitutes a Schottky barrier diode 83.

While the present disclosure is described in an embodiment in which the various material layers within the layer stack are deposited in the order of a second battery electrode material layer, an energy storage medium material layer, an optional blocking dielectric material layer, an optional conductive metal oxide material layer, a common electrode material layer, a compound semiconductor material layer, and a first diode electrode material layer, embodiments are contemplated herein in which the various material layers within the layer stack are deposited in reverse order. In this embodiment, the battery structure 20 may overlie the energy harvesting device 80.

Generally, a stack of a battery structure 20 and an energy harvesting device 80 may be formed. The battery structure 20 may include, from one end to another, a second battery electrode 18, an energy storage medium 22, a blocking dielectric layer 24, a conductive metal oxide layer 26, and a common electrode 28 (which may be configured to operate as at least a first battery electrode). The energy harvesting device 80 may include a Schottky barrier photodiode 83, and may include, from one end to another, a second diode electrode (which may comprise the common electrode 28), a compound semiconductor material plate 82, and a first diode electrode 84.

In one embodiment, the second battery electrode 18 may be formed on one of the metal interconnect structures such as on a top surface of a fourth metal line structure 648. In some embodiments, the second battery electrode 18 may comprise the fourth metal line structure 648. In other words, the fourth metal line structure 648 may be configured to operate as the second battery electrode 18. The second battery electrode 18 may comprise, and/or consist essentially of, a conductive material such as an elemental metal, an intermetallic alloy, a conductive metal nitride (such as TiN, TaN, WN, or MoN), a conductive oxide material (such as indium tin oxide, indium zinc oxide, or aluminum zinc oxide), a conductive polymer material, graphene, carbon nanotubes, or other conductive materials that may effective function as a conductive barrier material for the energy storage medium 22. The thickness of the second battery electrode 18 may be in a range from 5 nm to 100 nm, although lesser and greater thicknesses may also be used.

The energy storage medium 22 may comprise, and/or consist essentially of, an ionic crystal plate including an ionic crystal. The ionic crystal may have ionic conductivity greater than $1.0 \times 10^{-5}$ S/cm in a temperature range from −40 degrees Celsius to 125 degrees Celsius. Non-limiting examples of ionic crystals comprise lithium fluoride, lithium chloride, lithium bromide, lithium iodide, potassium fluoride, potassium chloride, potassium bromide, potassium iodide, sodium fluoride, etc. The thickness of the energy storage medium 22 may be in a range from 30 nm to 1,000 nm, such as from 100 nm to 500 nm, although lesser and greater thicknesses may also be used.

The blocking dielectric layer 24 comprises, and/or consists essentially of, a dielectric metal oxide material. Non-limiting examples of the dielectric metal oxide material comprise aluminum oxide, hafnium oxide, zirconium oxide, titanium oxide, tantalum oxide, manganese oxide, lanthanum oxide, yttrium oxide, etc. The thickness of the blocking dielectric layer 24 may be selected such that electrons may tunnel through the blocking dielectric layer 24 while ions are blocked by the blocking dielectric layer 24. For example, the thickness of the blocking dielectric layer 24 may be in a range from 1 nm to 2 nm, although lesser and greater thicknesses may also be used.

In embodiments in which the conductive metal oxide layer 26 is present, the conductive metal oxide layer 26 may comprise, and/or consist essentially of, a thin layer of conductive transition metal oxide such as ruthenium oxide. In such embodiments, the thickness of the conductive metal oxide layer 26 may be in a range from 0.3 nm to 2.0 nm, such as from 0.6 nm to 1.2 nm, although lesser and greater thicknesses may also be used. In one embodiment, the conductive metal oxide layer 26 may comprise a surface oxide of a metal of the common electrode 28 that is formed by oxidation upon contact with the blocking dielectric layer 24.

The common electrode 28 may comprise, and/or consist essentially of, a metallic material including at least one transition metal or a conductive metal oxide material. For example, the common electrode 28 may comprise, and/or may consist essentially of, Ti, Ta, W, Ru, Rh, Co, Mo, Nb, Pd, Pt, Re, Os, or Ir. Alternatively, the common electrode 28 may comprise, and/or may consist essentially of, a conductive metal oxide material such as indium tin oxide, indium zinc oxide, or aluminum zinc oxide. The common electrode 28 may be configured to function as a first battery electrode of the battery structure 20 as well as a second diode electrode of the energy harvesting device 80. The thickness of the common electrode 28 may be in a range from 10 nm to 100 nm, although lesser and greater thicknesses may also be used.

Generally, the material of the common electrode 28 may be different from the material of the first diode electrode such that the energy harvesting device 80 may have an asymmetry in terms of band structures about the compound semiconductor material plate 82, and one Schottky barrier diode 83 becomes dominant over another, thereby enabling operation of the energy harvesting device 80 as a Schottky barrier diode 83. The common electrode 28 functions as the second diode electrode of the Schottky barrier diode 83.

The compound semiconductor material plate 82 may comprise, and/or consist essentially of, a compound semiconductor material having a band gap energy in a range from 0.1 eV to 0.35 eV. The band gap energy of the compound semiconductor material plate 82 is small compared to the band gap energy of typical semiconductor materials used in field effect transistors or other semiconductor devices used in the semiconductor industry. Particularly, the band gap energy of the compound semiconductor material plate 82 may be selected to capture energy from electromagnetic radiation having a wavelength greater than 2 microns, which is within a deep infrared range. A wavelength of 2 microns corresponds to a photon energy of about 0.62 eV, and a wavelength of 5 microns corresponds to a photon energy of about 0.25 eV. A compound semiconductor material having a band gap energy in a range from 0.1 eV to 0.35 eV may effectively absorb photons having an energy range from about 0.25 eV to about 0.62 eV. It is understood that the efficiency of photon absorption is the highest when the energy of the photon is greater than the band gap energy due to some energy loss (which is on the order of about 0.1 eV to 0.3 eV) that occurs during absorption of the photons. Thus, the band gap energy of the compound semiconductor material plate 82 is optimized for absorption of photons having wavelengths in a range from about 2 microns to about 5 microns.

In an illustrative example, the compound semiconductor material comprises, and/or consists essentially of, a material selected from indium antimonide (InSb), indium arsenide (InAs), lead telluride (PbTe), or bismuth telluride ($Bi_2Te_3$). The compound semiconductor material of the compound semiconductor material plate 82 may be suitably doped with p-type dopants or n-type dopants to increase the effectiveness of the Schottky barrier junction that is formed at the interface with the first diode electrode 84. Generally, the compound semiconductor material of the compound semiconductor material plate 82 may be selected to provide a narrow band gap that is less than 0.35 eV to detect thermal radiation for high efficiency electrical current generation. Preferably, the band gap of the compound semiconductor material is greater than 0.1 eV to ensure that the compound semiconductor material behaves as a semiconductor material, i.e., does not display excessive electrical conductivity that adversely impacts operation of the Schottky barrier diode 83. The thickness of the compound semiconductor material plate 82 may be selected to provide a drift zone for electrical charges in the compound semiconductor material plate 82. For example, the thickness of the compound semiconductor material plate 82 may be in a range from 100 nm to 2,000 nm, such as from 300 nm to 1,000 nm, although lesser and greater thicknesses may also be used.

Generally, the band gap energy of the compound semiconductor material of the compound semiconductor material plate 82 may be in a range from 0.10 eV to 0.35 eV. FIG. 1 tabulates examples of such compound semiconductor materials that may be used for the compound semiconductor material plate 82.

TABLE 1

List of selected materials that may be used for the compound semiconductor material plate, their band gap energy, and their electron affinity

| Compound semiconductor material | Band gap energy (in eV) | Electron Affinity (in eV) |
|---|---|---|
| InSb | 0.17 | 4.59 |
| InAs | 0.35 | 4.90 |
| PbTe | 0.32 | 4.60 |
| Bi2Te3 | 0.12 | 5.20 |

The first diode electrode 84 includes a high work function material layer that may comprise high work function material. As used herein, a high work function material refers to a material having a work function greater than 4.5 eV. Generally, a work function greater than 4.5 eV may provide an effective Schottky barrier junction at the interface between the first diode electrode 84 and the compound semiconductor material plate 82. In an illustrative example, the high work function material comprises a material selected from a transparent conductive oxide (such as indium tin oxide, indium zinc oxide, or aluminum zinc oxide), ruthenium, rhodium, cobalt, gold, palladium, nickel, iridium, or platinum. As discussed above, the material of the first diode electrode 84 may be different from the material of the second diode electrode (which may comprise the common electrode 28) so that the Schottky barrier diode 83 at the interface between the first diode electrode 84 and the compound semiconductor material plate 82 may predominant over any junction that may be formed at the interface between the compound semiconductor material plate 82 and the common electrode 28.

Generally, the high work function material of the first diode electrode 84 has a work function greater than 4.5 eV. Table 2 tabulates examples of such high work function materials that may be used for the first diode electrode 84.

TABLE 2

List of selected materials that may be used for the first diode electrode and their work function

| Electrode material | Work function (in eV) |
| --- | --- |
| Ru | 4.71 |
| Indium tin oxide | 4.85 |
| Rh | 4.98 |
| Co | 5.00 |
| Au | 5.10 |
| Pd | 5.12 |
| Ni | 5.15 |
| Ir | 5.27 |
| Pt | 5.65 |

Generally, the energy harvesting device 80 may comprise a Schottky barrier diode 83 including a Schottky barrier junction that is located at an interface between a high work function plate (comprising the first diode electrode 84) including a high work function material having a work function greater than 4.5 eV and a compound semiconductor material plate 82 including a compound semiconductor material. The energy harvesting device 80 may comprise a first diode electrode 84 located on a first side of the Schottky barrier diode 83, and a second diode electrode (which may comprise the common electrode 28) that is connected to a second side of the Schottky barrier diode 83.

In one embodiment, the energy harvesting device 80 and the battery structure 20 (including the energy storage medium 22) may have a same shape and a same size in a plan view along a vertical direction (for example, by patterning the layer stack using an anisotropic etch process). In this embodiment, all sidewalls of the energy harvesting device 80 and all sidewalls of the battery structure 20 may be vertically coincident, i.e., may be located within a same set of vertical planes. The lateral dimensions of the energy harvesting device 80 and the battery structure 20 may vary depending on the energy storage capacity requirement for the battery structure 20. In an illustrative example, the lateral dimensions of the energy harvesting device 80 and the battery structure 20 may be generally in a range from 200 nm to 100,000 nm, such as from 1,000 nm to 10,000 nm, although lesser and greater dimensions may also be used. The horizontal cross-sectional shape of the combination of the energy harvesting device 80 and the battery structure 20 may be any two-dimensional curvilinear shape having a closed periphery (such as a circle, an oval, a rectangle, any other polygon, etc.).

According to an embodiment of the present disclosure, the Schottky barrier diode 83 may be used to harvest electricity from infrared radiation for radiation source temperatures lower than 1,000 K. For example, a radiation source having a surface temperature in range from 300 K to 600 K may function as an effective radiation source for the Schottky barrier diode 83 so that the Schottky barrier diode 83 may function as a photodiode. Further, the Schottky barrier diode 83 in various embodiments may be integrated with complementary metal-oxide-semiconductor (CMOS) integrated circuits (IC). In various embodiments, the working radiation source temperature range for the Schottky barrier diode 83 may match the temperature of thermal radiation sources (such as the field effect transistors) within the integrated circuit. In one embodiment, the Schottky barrier diode 83 may function as a Schottky barrier photodiode for infrared radiations with wavelengths in a range from 2 microns to 5 microns.

In some embodiments, the Schottky barrier diode 83 may harvest electricity from relatively low temperature radiation sources at a temperature less than 600 K by using a narrow band gap semiconductor material for the compound semiconductor material plate 82, which is the semiconductor component of the Schottky barrier photodiode 83. Further, in some embodiments, the energy harvesting device 80 may be integrated with the battery structure 20 so that the electrical energy generated from the energy harvesting device 80 may be stored in the battery structure 20. Specifically, the common electrode 28 is a common component between the energy harvesting device 80 and the battery structure 20, and may provide a series electrical connection between the Schottky barrier and the energy storage device 20.

Figure 3A:
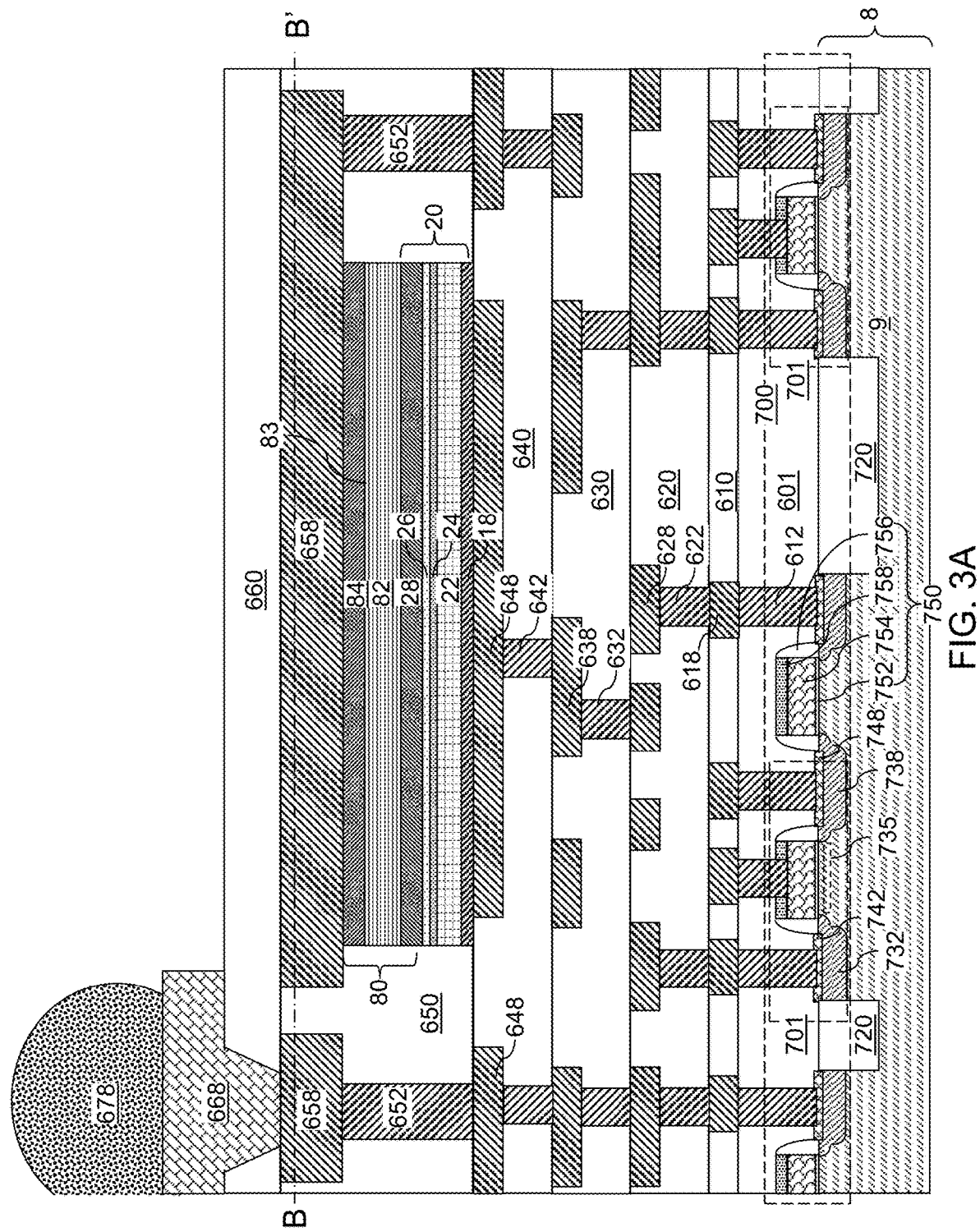
FIG. 3A is a vertical cross-sectional view of the first exemplary structure after formation of top-level interconnect structures and bonding structures according to an embodiment of the present disclosure.
Figure 3B:
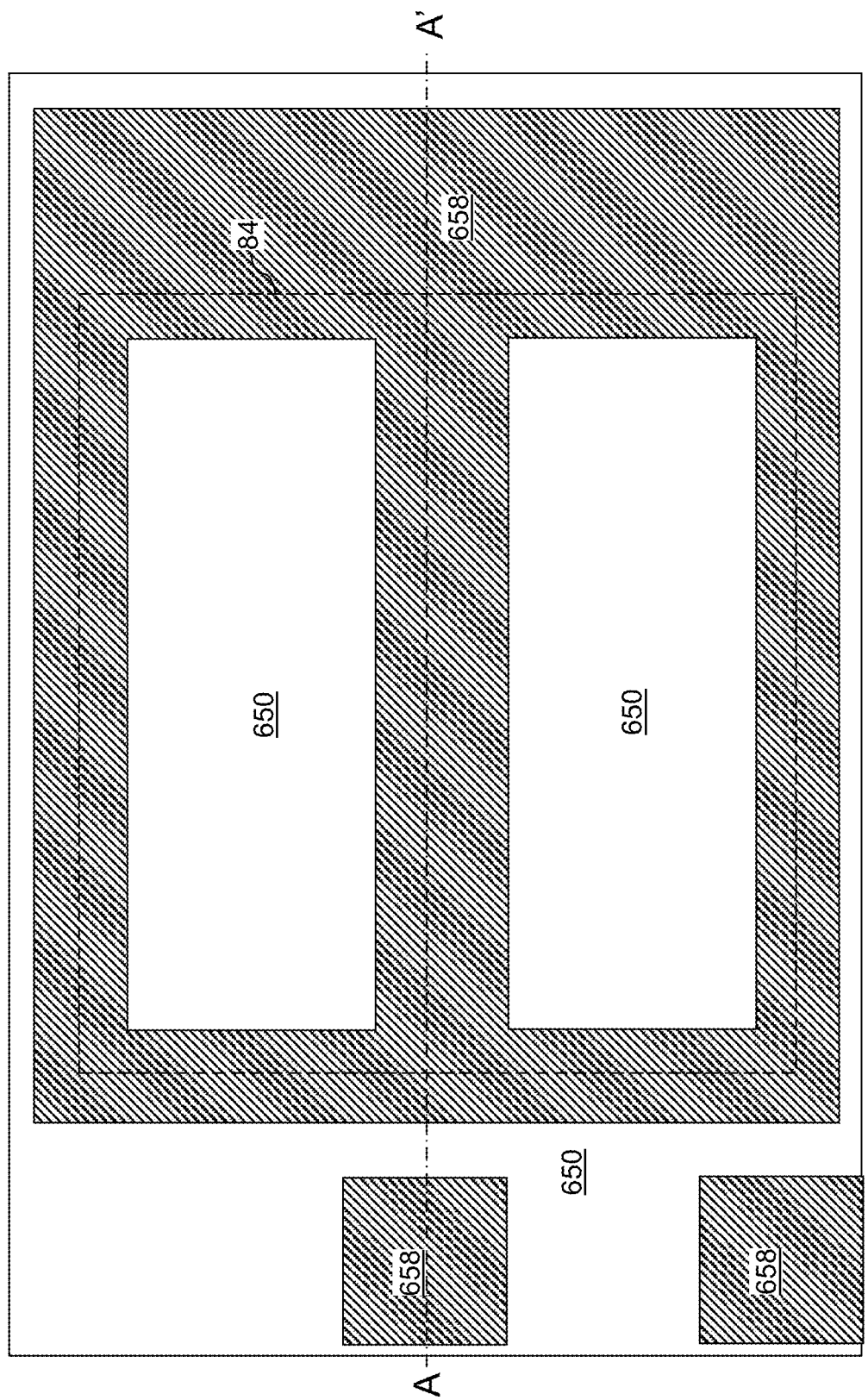
FIG. 3B is a horizontal cross-sectional view along the horizontal plane B-B' of FIG. 3A. The vertical plane A-A' is the plane of the vertical cross-sectional view of FIG. 3A.

Referring to FIGS. 3A and 3B, additional metal interconnect structures may be formed to electrically connect the first diode electrode 84 to one of the metal interconnect structures (612, 618, 622, 628, 632, 638, 642, 648). For example, a top interconnect-level dielectric material layer 650 may be formed over the stack of the battery structure 20 and the energy harvesting device 80, and may be planarized to provide a planar top surface. Top-level interconnect structures (652, 658) may be formed in the top interconnect-level dielectric material layer 650. The top-level interconnect structures (652, 658) may comprise top-level metal via structures 652 and top-level metal pad structures 658. One of the top-level metal pad structures 658 may comprise a portion or an entirety of the top surface of the first diode electrode 84. A bonding-level dielectric layer 660 (such as a passivation dielectric layer including silicon nitride or polyimide) may be formed over the top interconnect-level dielectric material layer 650. Openings may be formed through the bonding-level dielectric layer 660 within areas of a subset of the top-level metal pad structures 658 that are configured as metal contact pads. Bonding structures 668 such as under-bump metallization (UBM) pads may be formed in the openings on a respective one of the top-level metal pad structures 658. A solder material portion 678 may be subsequently attached to each bonding structure 668 so that the semiconductor die may be bonded to another structure (such as an interposer).

Generally, the first diode electrode 84 of the Schottky barrier diode 83 may be electrically connected to a first metal interconnect structure selected from the metal interconnect structures (612, 618, 622, 628, 632, 638, 642, 648), and the second battery electrode 18 of the battery structure 20 may be electrically connected to a second metal interconnect structure selected from the metal interconnect structures (612, 618, 622, 628, 632, 638, 642, 648). Generally, the metal interconnect structures (612, 618, 622, 628, 632, 638, 642, 648) may be located within dielectric material layers (601, 610, 620, 630, 640) overlying the semiconductor devices, and may electrically connect the first diode electrode 84 to a first node of the semiconductor devices and the second battery electrode 18 to a second node of the semiconductor devices.

In the first exemplary structure illustrated in FIGS. 3A and 3B, the Schottky barrier photodiode 83 is formed as a planar Schottky barrier diode 83 in which the entirety of the Schottky barrier junction is located within a horizontal plane. In one embodiment, the top-level metal pad structures 658 overlying the first diode electrode 84 may be patterned with openings to allow passage of thermal radiation therethrough. Alternatively, the top-level metal pad structure 658 may contact the entire area of the top surface of the first diode electrode 84.

Figure 3C:
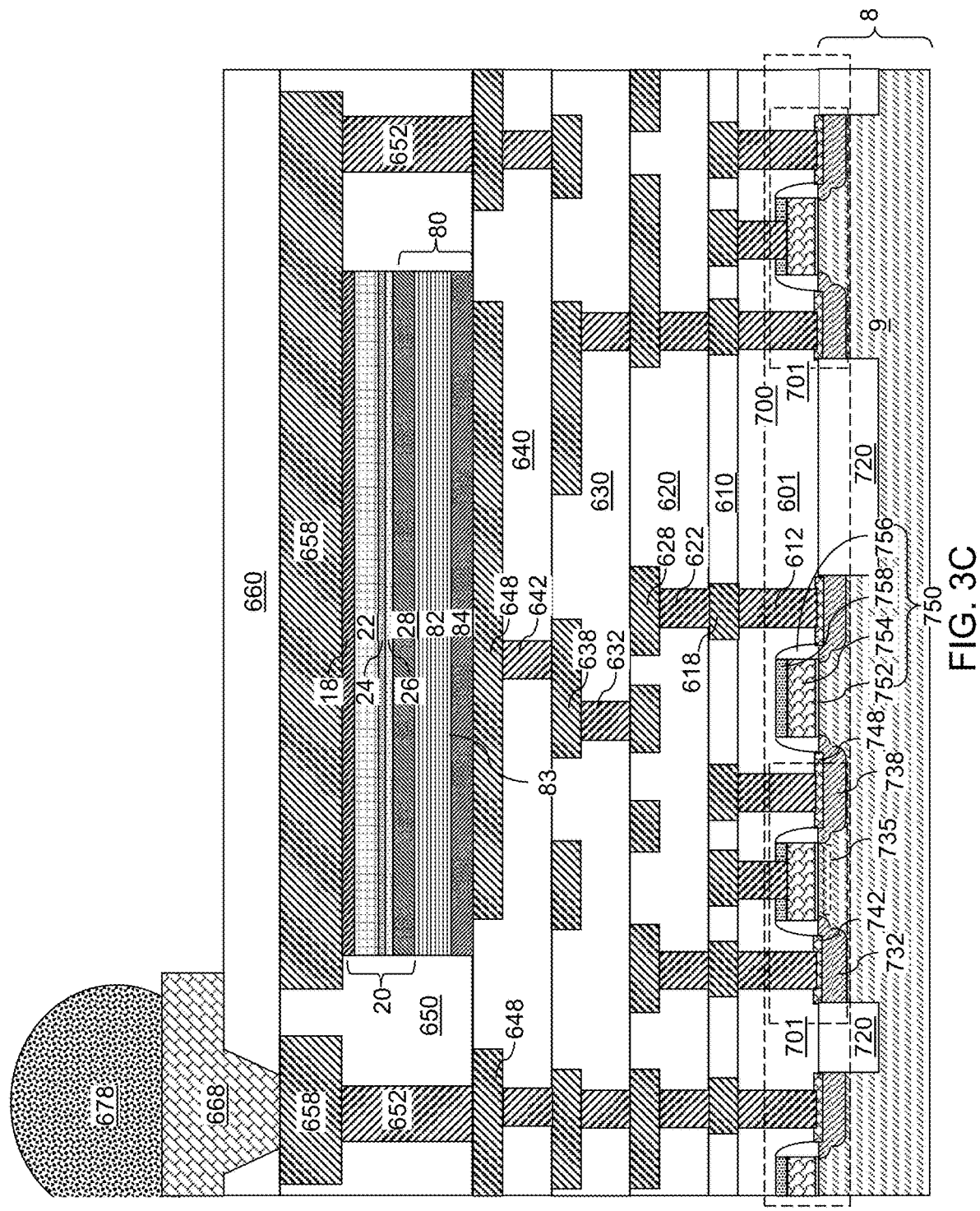
FIG. 3C is a vertical cross-sectional view of an alternative configuration of the first exemplary structure according to an embodiment of the present disclosure.

Referring to FIG. 3C, an alternative configuration of the first exemplary structure may be derived from the first exemplary structure illustrated in FIGS. 3A and 3B by reversing the order of the layer stack for the energy harvesting device 80 and the battery structure 20. In this embodiment, the layer stack may include, from bottom to top, a first diode electrode 84, a compound semiconductor material plate 82, a common electrode 28 (which is both a second diode electrode and a first battery electrode), a conductive metal oxide layer 26, a blocking dielectric layer 24, an energy storage medium 22, and a second battery electrode 18. Generally, the order of the layer stack may be reversed for any of the embodiments of the present disclosure.

Figure 4A:
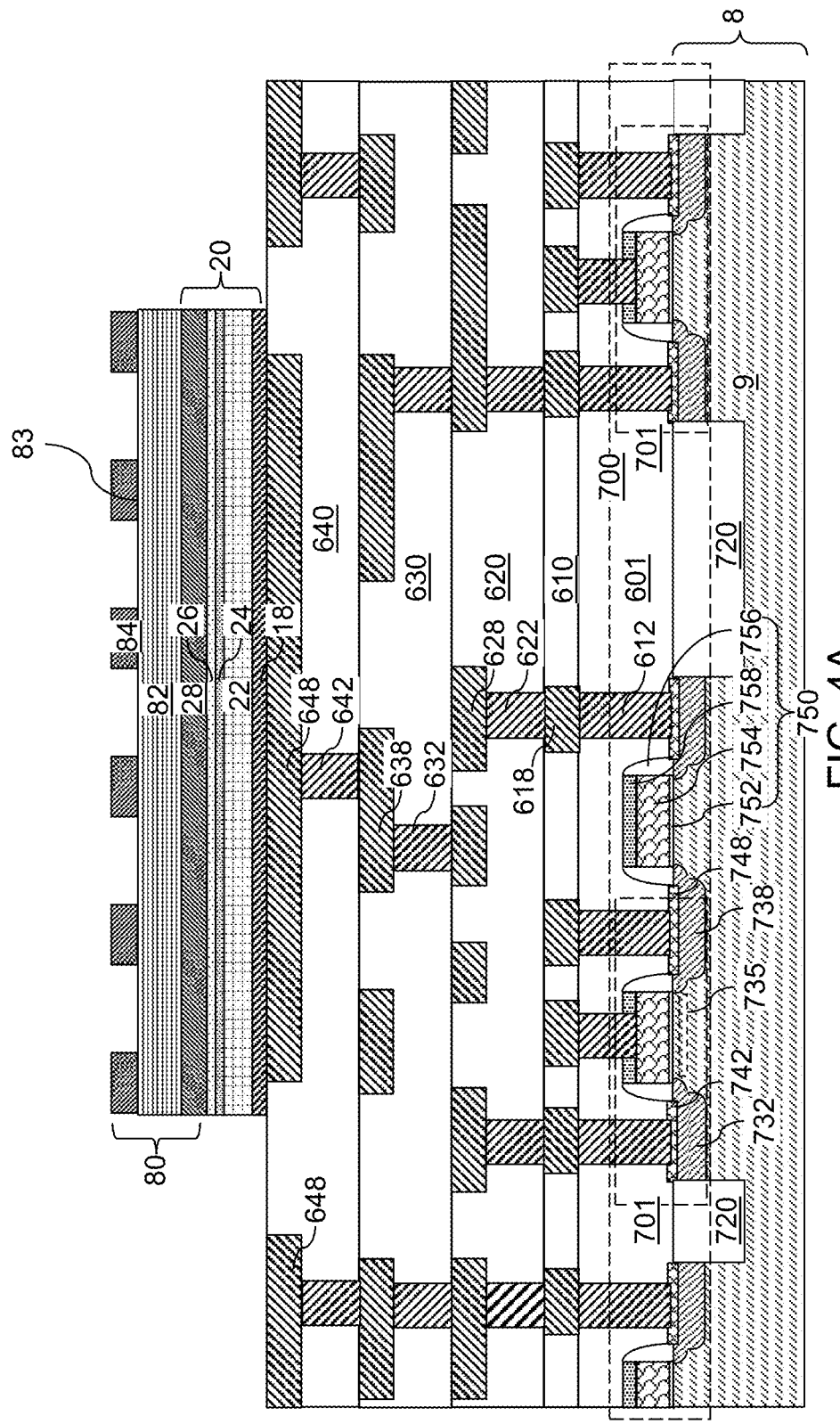
FIG. 4A is a vertical cross-sectional view of a second exemplary structure after formation of a stack of a battery structure and an energy harvesting device according to an embodiment of the present disclosure.
Figure 4B:
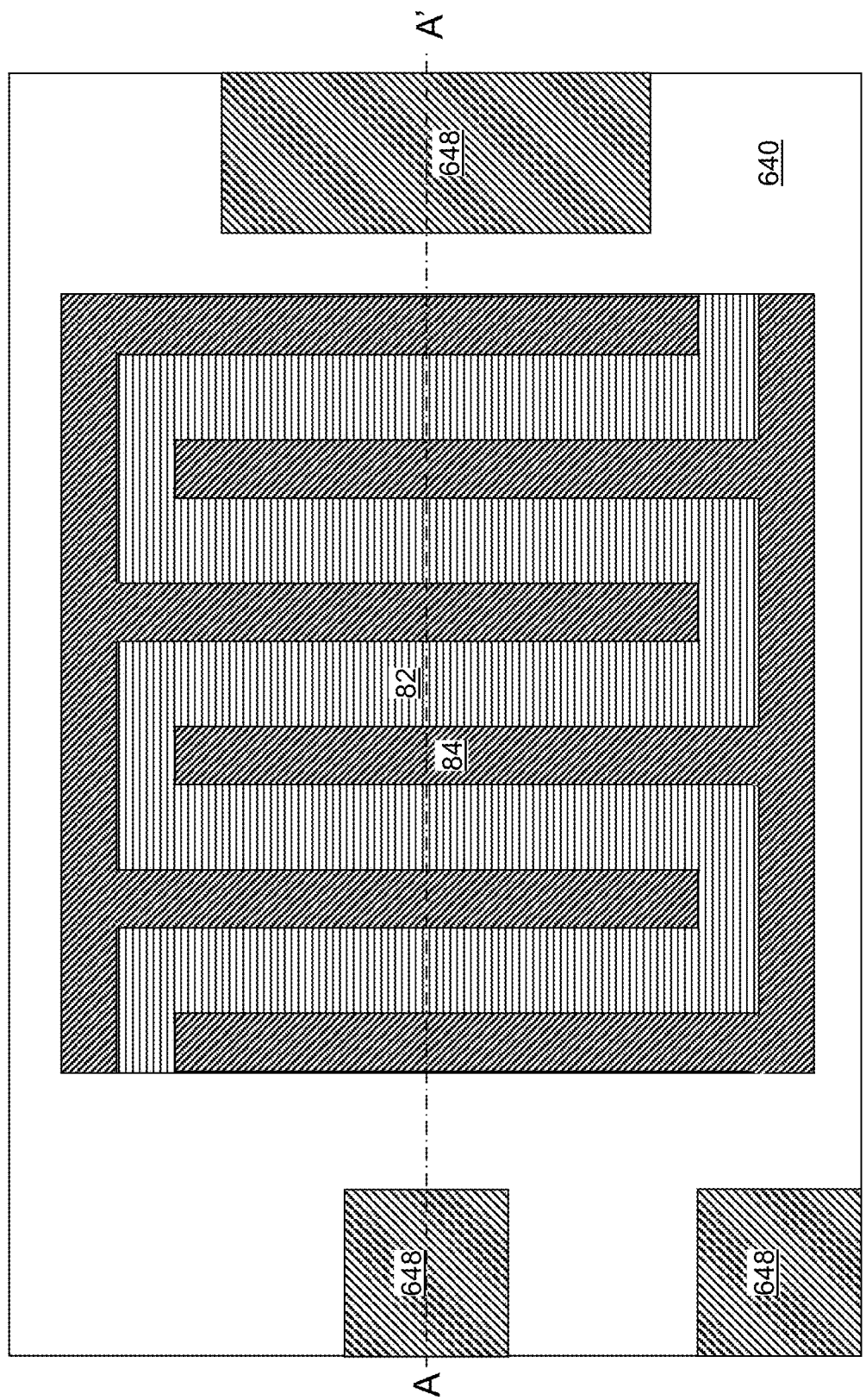
FIG. 4B is a top-down view of the second exemplary structure of FIG. 4A. The vertical plane A-A' is the plane of the vertical cross-sectional view of FIG. 4A.

Referring to FIGS. 4A and 4B, a second exemplary structure according to an embodiment of the present disclosure may be derived from the first exemplary structure illustrated in FIGS. 2A and 2B by applying a photoresist layer over the first exemplary structure of FIGS. 2A and 2B, by patterning the photoresist layer to form openings within the area of the energy harvesting device 80, and by etching portions of the first diode electrode 84 that are not masked by the photoresist layer. The photoresist layer may be subsequently removed, for example, by ashing.

The first diode electrode 84 may be patterned such that the area of the first diode electrode 84 is less than the area of the compound semiconductor material plate 82. The compound semiconductor material plate 82 and the entirety of the battery structure 20 may have a same area. Thus, the sidewalls of the compound semiconductor material plate 82 and the sidewalls of the battery structure 20 may be vertically coincident, i.e., may be located within a same set of vertical planes such that each vertical plane includes a sidewall of the compound semiconductor material plate 82 and a sidewall of the battery structure 20.

The Schottky barrier diode 83 comprises a Schottky barrier junction located at an interface between a high work function plate (comprising the first diode electrode 84) including a high work function material having a work function greater than 4.5 eV and a compound semiconductor material plate 82 including a compound semiconductor material. The high work function plate (i.e., the first diode electrode 84) may have openings therethrough and the compound semiconductor material plate 82 has a greater area in a plan view than the high work function plate, and may not include any opening therethrough. The area of the Schottky barrier junction may be the same as the area of the first diode electrode 84. The openings in the first diode electrode 84 may allow thermal radiation to pass through from outside the semiconductor die toward the compound semiconductor material plate 82. In one embodiment, the first diode electrode 84 may have a digitated pattern, such as a multi-finger pattern, so that high efficiency absorption of thermal radiation may be effected.

Figure 5A:
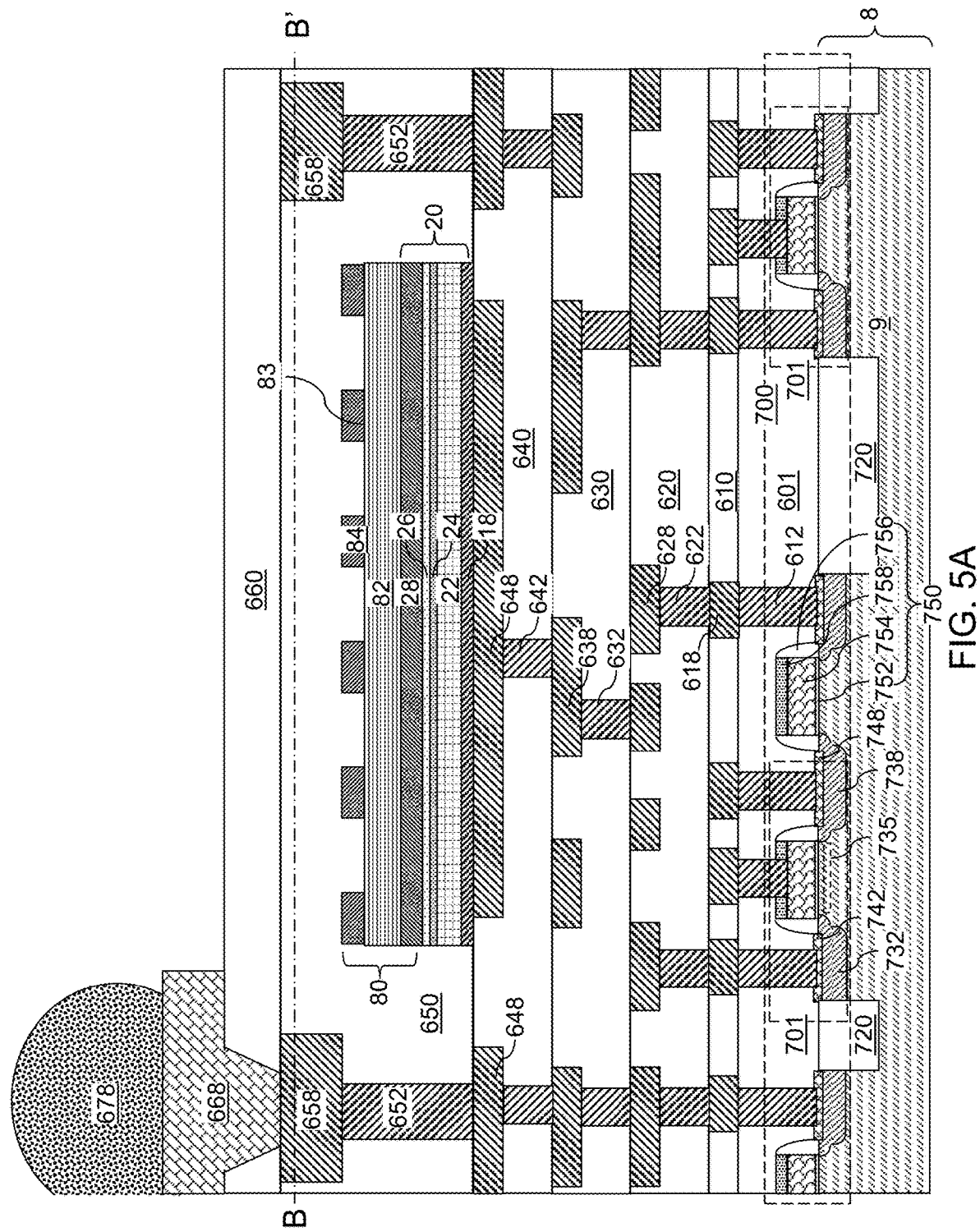
FIG. 5A is a vertical cross-sectional view of the second exemplary structure after formation of top-level interconnect structures and bonding structures according to an embodiment of the present disclosure.
Figure 5B:
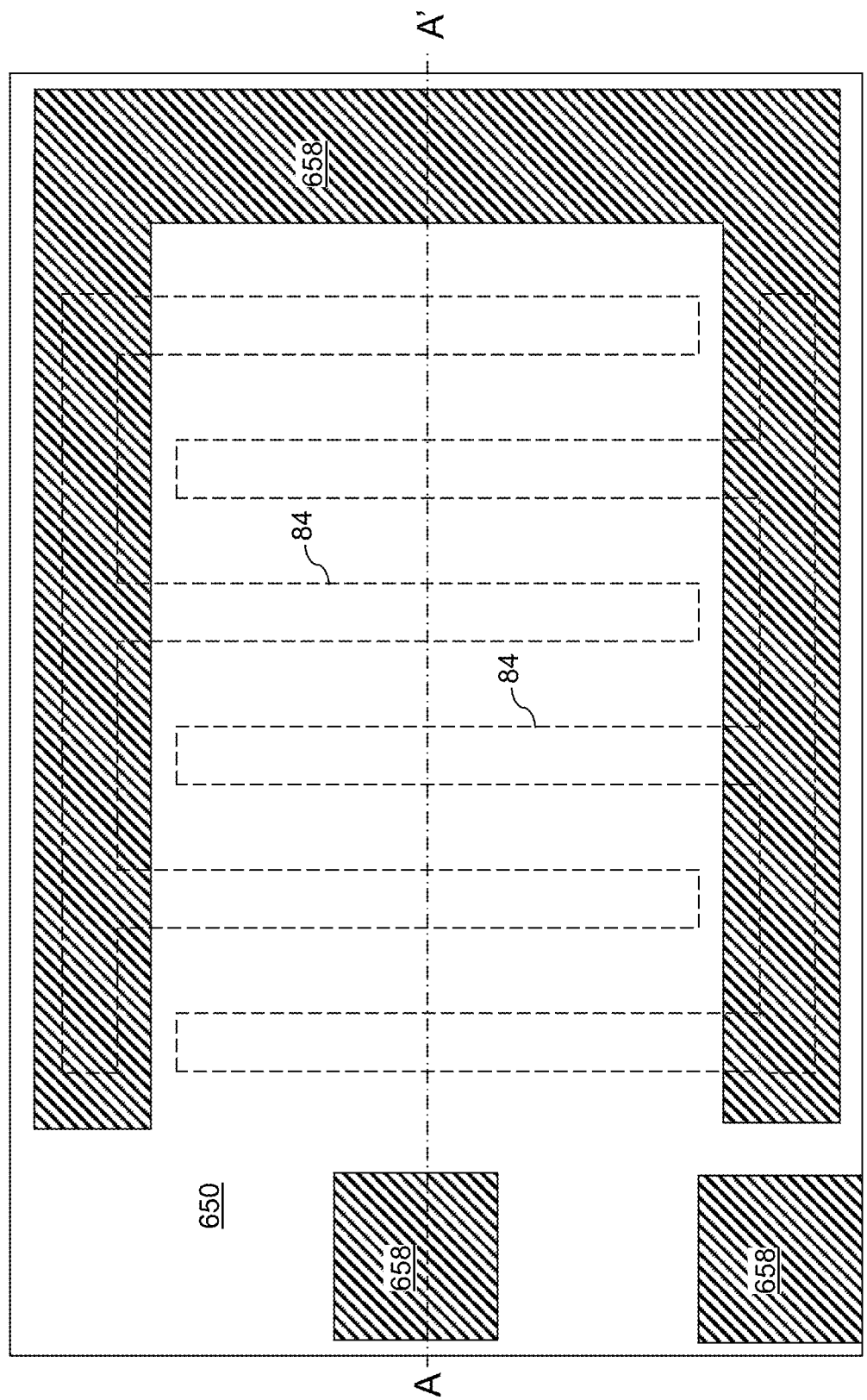
FIG. 5B is a horizontal cross-sectional view along the horizontal plane B-B' of FIG. 5A. The vertical plane A-A' is the plane of the vertical cross-sectional view of FIG. 5A.

Referring to FIGS. 5A and 5B, the processing steps of FIGS. 3A and 3B may be performed mutatis mutandis to form a top interconnect-level dielectric material layer 650, top-level interconnect structures (652, 658), a bonding-level dielectric layer 660, bonding structures 668, and solder material portions 678. For example, the pattern of the top-level metal pad structures 658 may be modified to minimize blocking of the areas of the openings in the pattern of the first diode electrode 84.

Figure 6A:
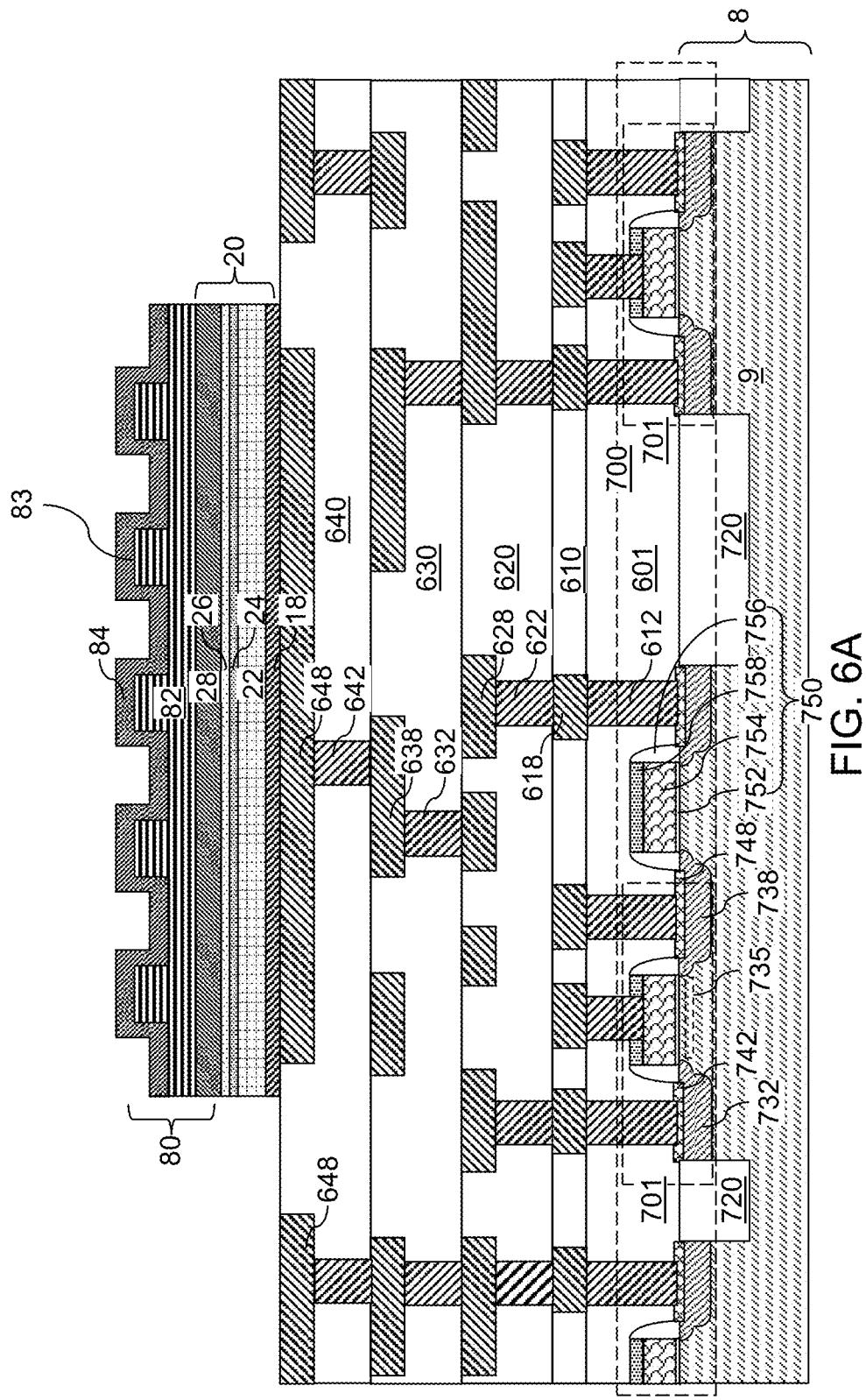
FIG. 6A is a vertical cross-sectional view of a third exemplary structure after formation of a stack of a battery structure and an energy harvesting device according to an embodiment of the present disclosure.

Referring to FIGS. 6A and 6B, a third exemplary structure according to an embodiment of the present disclosure may be derived from the first exemplary structure illustrated in FIGS. 2A and 2B by introducing a vertical modulation in the top surface of the compound semiconductor material layer prior to deposition of the high work function material layer (which comprises the first diode 84). For example, a photoresist layer (not shown) may be applied over the top surface of the compound semiconductor material layer 82, and may be lithographically patterned to form covered areas and uncovered areas. The ratio of the covered areas to the uncovered areas within the area in which the energy harvesting device 80 is to be formed may be in a range from 0.2 to 5, such as from 0.5 to 2.0. An etch process (which may comprise an anisotropic etch process or an isotropic etch process) may be performed to recess unmasked portions of the compound semiconductor material plate 82. The height of the steps (which may be vertical steps) in the patterned compound semiconductor material layer may be in a range from 20% to 95% of the thickness of the compound semiconductor material layer prior to performing the etch process. The photoresist layer may be subsequently removed, for example, by ashing. The first diode material layer 84 (i.e., the high work function material layer) may be subsequently deposited by a conformal deposition process or by a non-conformal deposition process. In one embodiment, the first diode material layer 84 may have a top surface having a vertically undulating surface profile. Subsequently, the layer stack of deposited material layers may be patterned to form a stack of a battery structure 20 and an energy harvesting device 80.

The interface between the compound semiconductor material plate 82 and the first diode electrode 84 has a vertical undulation so that the area of the Schottky barrier photodiode 83 in the third exemplary structure is greater than the area of the energy harvesting device 80 in a plan view (i.e., a view along the vertical direction). The top surface of the compound semiconductor material plate 82 may have raised horizontal surface segments, recessed horizontal surface segments, and vertical sidewall surface segments. The pattern of the areas of the recessed horizontal surface segments may be any pattern. Generally, a pattern that increases the total area of the vertical sidewall surface segments is preferred so that the total area of the Schottky barrier junction may be increased. In one embodiment, the pattern of the recessed horizontal surface segments may have a pattern of linear trenches or non-linear trenches. Generally, the higher the aspect ratio of the recessed regions (i.e., the ratio of the height of a neighboring pair of vertical sidewall surface segments to the width of a recessed horizontal surface segment), the greater the increase in the area of the Schottky barrier junction, and the greater the effectiveness of the energy harvesting device 80.

The Schottky barrier diode 83 comprises a Schottky barrier junction located at an interface between a high work function plate (comprising the first diode electrode 84) including a high work function material having a work function greater than 4.5 eV and a compound semiconductor material plate 82 including a compound semiconductor material. The high work function plate (i.e., the first diode electrode 84) has openings therethrough and the compound semiconductor material plate 82 does not include any opening therethrough. The area of the Schottky barrier junction is greater than the area of the first diode electrode 84.

Figure 7A:
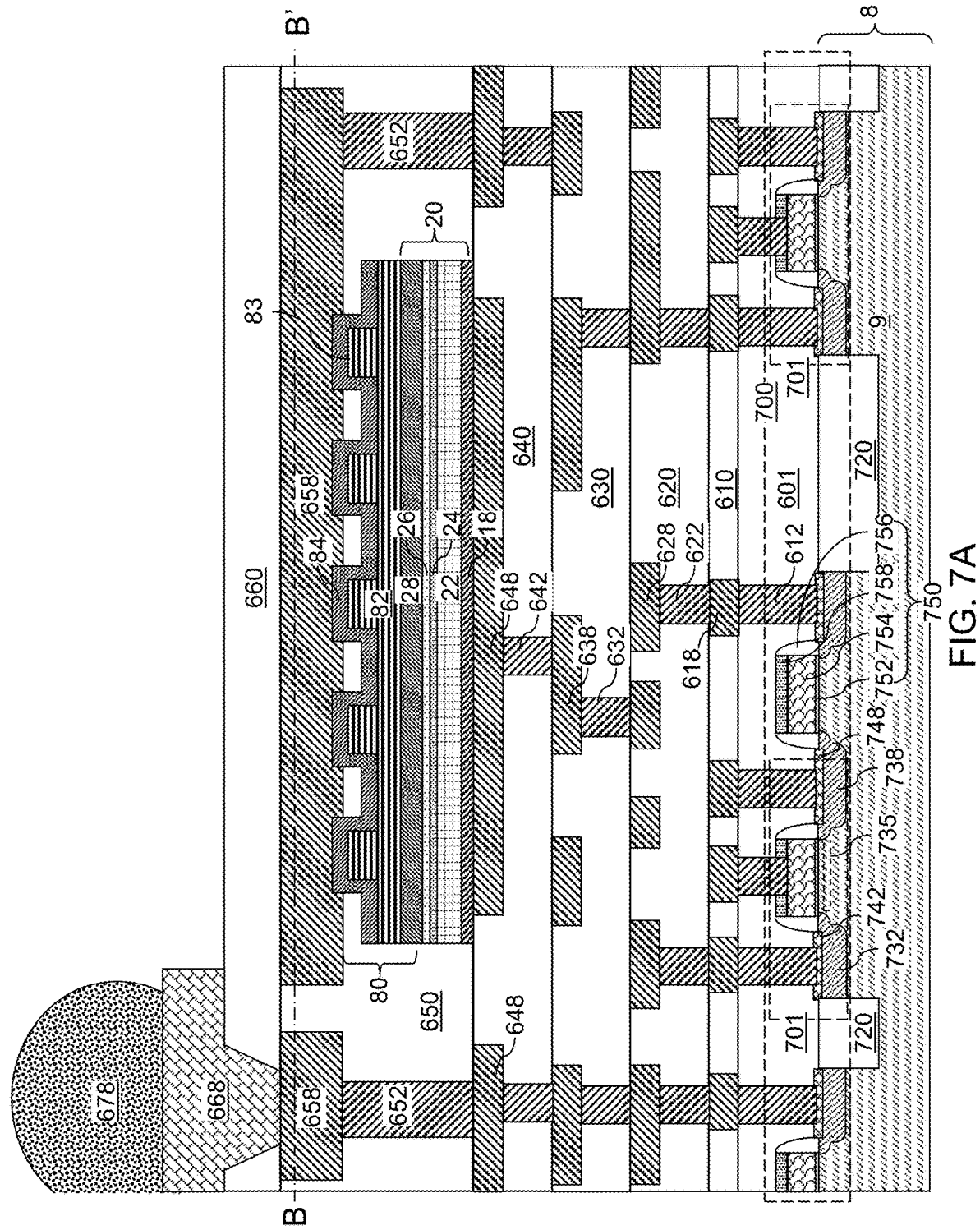
FIG. 7A is a vertical cross-sectional view of the third exemplary structure after formation of top-level interconnect structures and bonding structures according to an embodiment of the present disclosure.
Figure 7B:
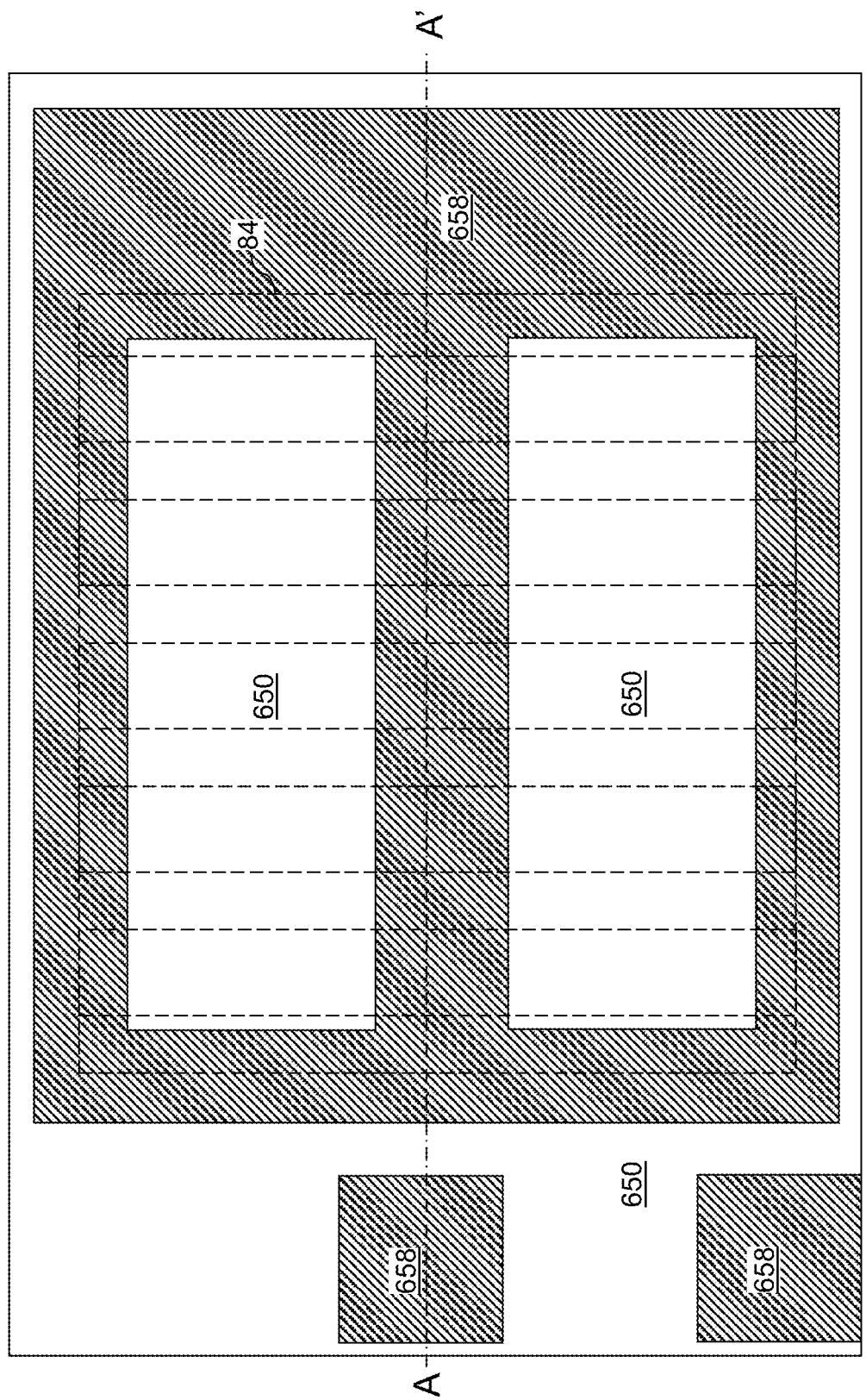
FIG. 7B is a horizontal cross-sectional view along the horizontal plane B-B' of FIG. 7A. The vertical plane A-A' is the plane of the vertical cross-sectional view of FIG. 7A.

Referring to FIGS. 7A and 7B, the processing steps of FIGS. 3A and 3B may be performed mutatis mutandis to form a top interconnect-level dielectric material layer 650, top-level interconnect structures (652, 658), a bonding-level dielectric layer 660, bonding structures 668, and solder material portions 678. A top-level metal pad structure 658 overlying the first diode electrode 84 may contact only raised horizontal surface segments of the top surface of the first diode electrode 84, may contact raised horizontal surface segments and upper portions of the vertical sidewall surface segments of the first diode electrode 84, or may contact raised horizontal surface segments, vertical sidewall surface segments, and recessed horizontal surface segments of the first diode electrode 84 depending on the depth of cavities that are formed in the top interconnect-level dielectric layer 650. In the third exemplary structure, the Schottky barrier may have a vertical undulation in a vertical cross-sectional profile such that raised portions of the Schottky barrier are interlaced with recessed portions of the Schottky barrier.

Figure 8:
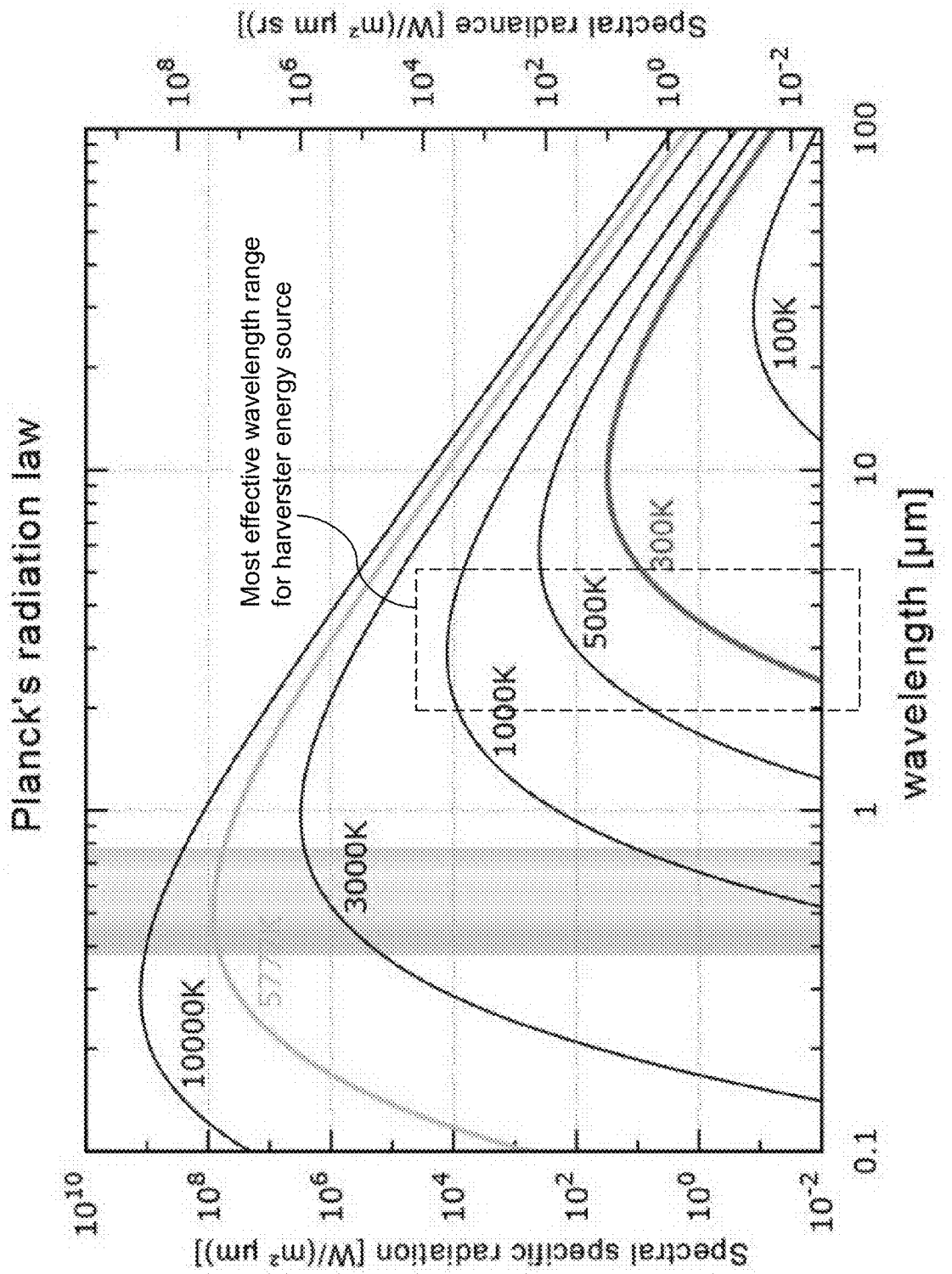
FIG. 8 is graph illustrating the spectral energy density in black body radiation at various emission temperatures.
Figure 9:
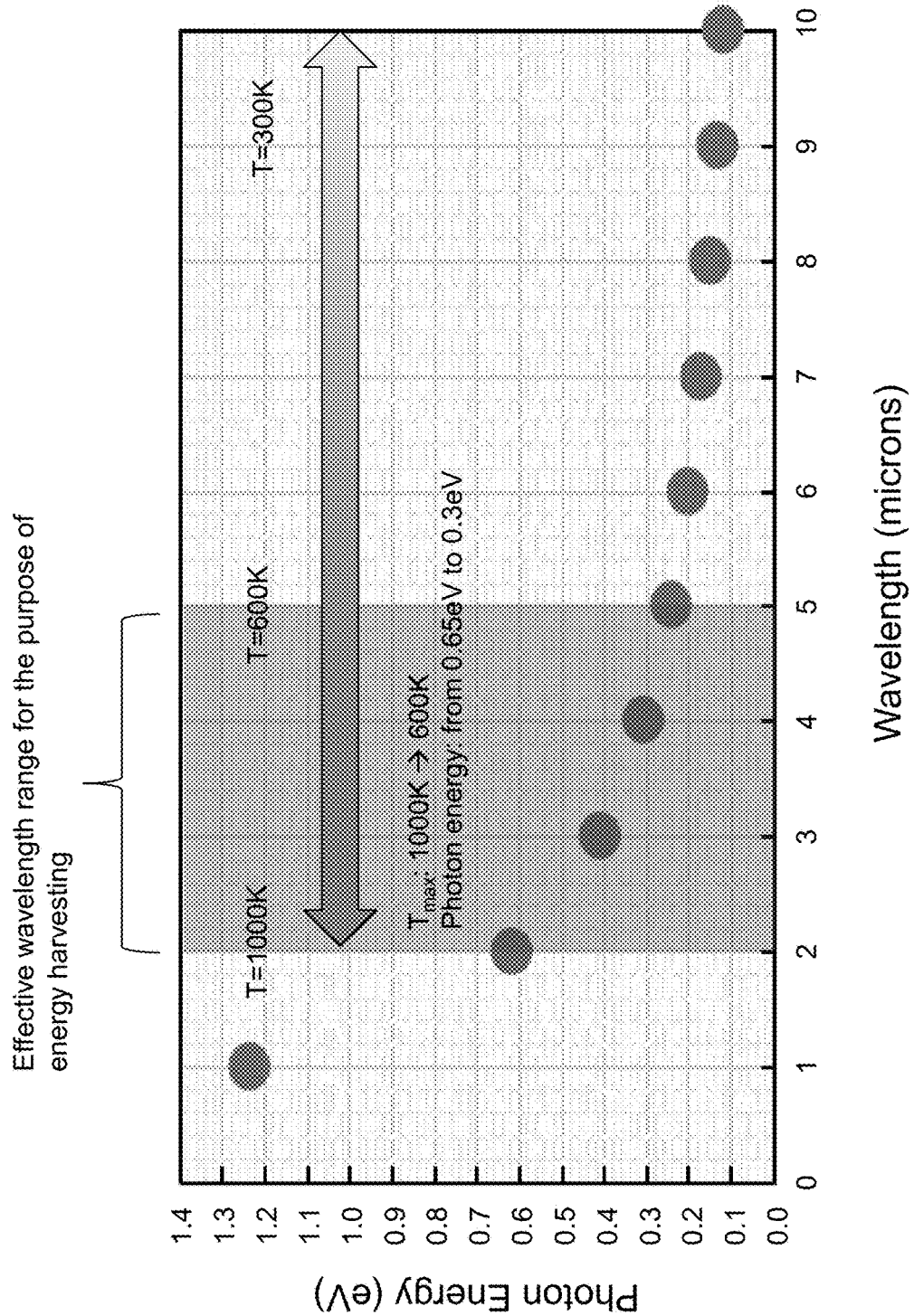
FIG. 9 is a graph illustrating the energy dependence of photons as a function of wavelength and the general temperature range for photon emission at a given wavelength.

FIG. 8 is graph illustrating the spectral energy density in black body radiation at various emission temperatures. FIG. 9 is a graph illustrating the energy dependence of photons as a function of wavelength and the general temperature range for photon emission at a given wavelength. Referring collectively to FIGS. 8 and 9, the combination of the energy harvesting device 80 and the battery structure 20 may capture thermal energy generated during operation of a semiconductor die into electrical energy. Specifically, as semiconductor devices heat up during operation, the semiconductor devices may emit infrared radiation with a spectral energy density that corresponds to the temperature of the heated semiconductor devices. Typically, the elevated temperatures of the semiconductor devices at the hottest locations (e.g., at a drain of a transistor) may be in a range from 300 K to 1,000 K. As illustrated in FIG. 9, as the temperature of a source decreases from 1,000 K to 600 K, the maximum photon energy changes from approximately 0.65 eV to approximately 0.30 eV. The photon energy range from 0.30 eV to 0.65 eV and the wavelength range from 2 microns to 5 microns corresponds to the hottest device self-heating temperatures.

Selection of a band gap from 0.10 eV to 0.35 eV for the compound semiconductor material in the compound semiconductor material plate 82 may maximize the photon capture efficiency for the thermal radiation in a wavelength range from 2 microns to 5 microns. The Schottky barrier provides the energy harvesting device 80 to function as a Schottky barrier photodiode 83 for infrared radiations having a wavelength range from about 2 microns to about 5 microns, and the photon energy may be captured by the energy harvesting device 80, is subsequently stored in the energy storage medium 22 of the battery structure 20.

Figure 10B:
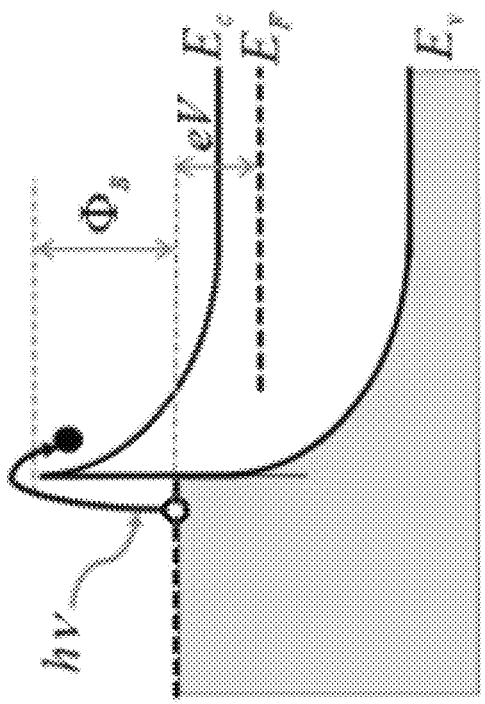
FIGS. 10A and 10B illustrate photon absorption mechanisms at a Schottky barrier.
Figure 10A:
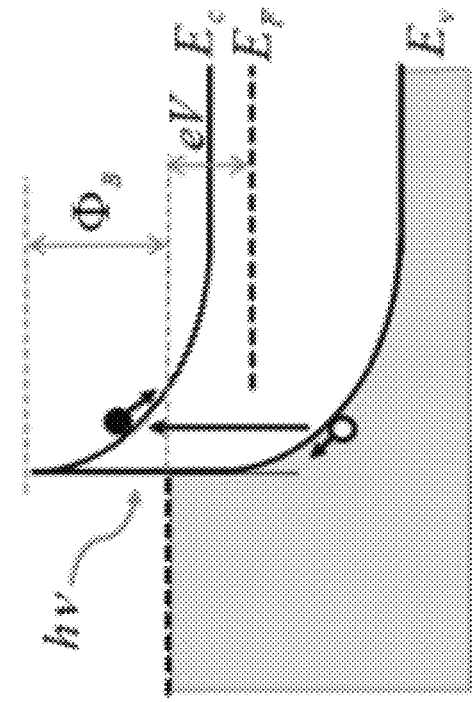

FIGS. 10A and 10B illustrate photon absorption mechanisms at a Schottky barrier. Generally, the photons from thermal radiation from heated components of semiconductor devices in the same semiconductor die or from heated components of semiconductor devices from another semiconductor die may impinge on the Schottky barrier photodiode 83, and may create a photogenerated pair of an electron and a hole. The mode of excitation may be different depending on the exact location of the photogeneration as illustrated in FIGS. 10A and 10B.

The electron-hole pair may drift in opposite directions from the Schottky barrier junction, thereby generating electromotive force (EMF) and transferring electrical charges of opposite types to the two battery electrodes (common electrode 28 and second battery electrode 18) and enabling the energy storage medium 22 of the battery structure 20 to store electrical energy therein. Generally, thermal light induce electron-hole pair generation around the Schottky barrier junction, and charge carriers are excited over the Schottky barrier. The electron-hole pairs generated in the depletion layer of the Schottky barrier flow to the two electrodes (28, 18) of the battery structure 20, and electrical energy may be stored in the battery structure 20. Field effect transistors may be used as switches that control release of the stored electrical energy in the battery structure 20. The released electrical energy may be advantageously used for various device operations.

Figure 11:
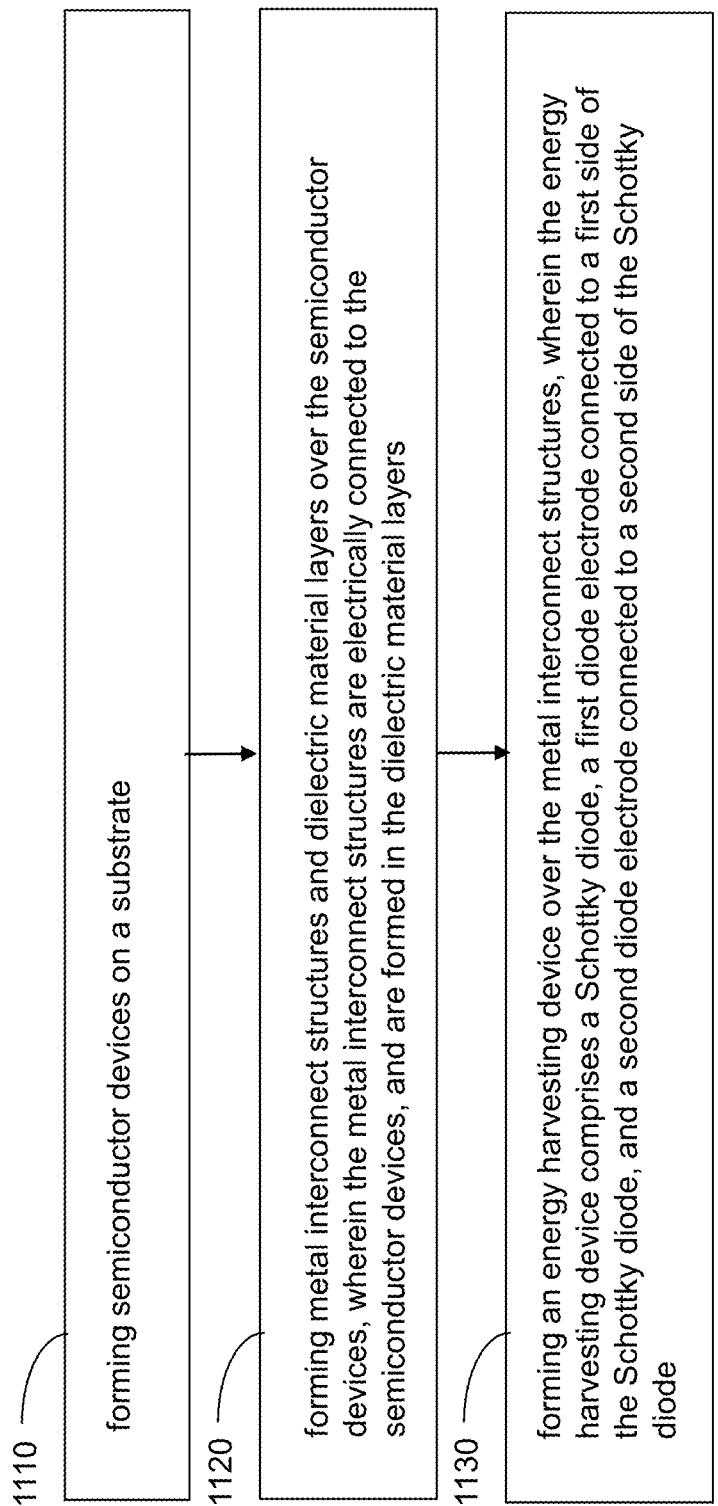
FIG. 11 is a flowchart that illustrates the general processing steps for manufacturing the semiconductor devices of the present disclosure according to an embodiment of the present disclosure.

FIG. 11 is a flowchart that illustrates the general processing steps for manufacturing the semiconductor devices of the present disclosure according to an embodiment of the present disclosure.

Referring to step 1110 and FIG. 1, semiconductor devices may be formed on a substrate 8.

Referring to step 1120 and FIG. 1, metal interconnect structures (612, 618, 622, 628, 632, 638, 642, 648) and dielectric material layers (601, 610, 620, 630, 640) may be formed over the semiconductor devices 701. The metal interconnect structures (612, 618, 622, 628, 632, 638, 642, 648) may be electrically connected to the semiconductor devices, and may be formed in the dielectric material layers (601, 610, 620, 630, 640).

Referring to step 1130 and FIGS. 2A-10B, an energy harvesting device 80 may be formed over the metal interconnect structures (612, 618, 622, 628, 632, 638, 642, 648). The energy harvesting device 80 comprises a Schottky barrier diode 83, a first diode electrode 84 located on a first side of the Schottky barrier diode 83, and a second diode electrode (comprising a common electrode 28) connected to a second side of the Schottky barrier diode 83.

Referring to all drawings and according to various embodiments of the present disclosure, a semiconductor structure is provided, which comprises: semiconductor devices located on a substrate 8; metal interconnect structures (612, 618, 622, 628, 632, 638, 642, 648) that are located within dielectric material layers (601, 610, 620, 630, 640) overlying the semiconductor devices 701 and are electrically connected to the semiconductor devices; and an energy harvesting device 80 located over the metal interconnect structures (612, 618, 622, 628, 632, 638, 642, 648) and comprising a Schottky barrier diode 83, a first diode electrode 84 located on a first side of the Schottky barrier diode 83, and a second diode electrode (comprising a common electrode 28) connected to a second side of the Schottky barrier diode 83.

In one embodiment, a battery structure 20 overlying the metal interconnect structures (612, 618, 622, 628, 632, 638, 642, 648) and comprising an energy storage medium 22, a first battery electrode 28 that is the same as the second diode electrode of the Schottky barrier diode 83, and a second battery electrode 18. In one embodiment, the first diode electrode 84 of the Schottky barrier diode 83 may be electrically connected to a first metal interconnect structure (612, 618, 622, 628, 632, 638, 642, 648) selected from the metal interconnect structures (612, 618, 622, 628, 632, 638, 642, 648); and the second battery electrode 18 of the battery structure 20 may be electrically connected to a second metal interconnect structure (612, 618, 622, 628, 632, 638, 642, 648) selected from the metal interconnect structures (612, 618, 622, 628, 632, 638, 642, 648). In one embodiment, the energy storage medium 22 comprises an ionic crystal plate including an ionic crystal having ionic conductivity greater than $1.0 \times 10^{-5}$ S/cm in a temperature range from −40 degrees Celsius to 125 degrees Celsius. In one embodiment, the battery structure 20 comprises a blocking dielectric layer 24 comprising a dielectric metal oxide material and located between the ionic crystal plate and the first diode electrode 28. In one embodiment, the battery structure 20 comprises conductive metal oxide layer 26 located between the blocking dielectric layer 24 and the first battery electrode 28. In one embodiment, the first battery electrode 28 comprises a metallic material including at least one transition metal or a conductive metal oxide material. In one embodiment, the Schottky barrier diode 83 comprises a Schottky barrier junction located at an interface between a high work function plate (e.g., first diode electrode 84) including a high work function material having a work function greater than 4.5 eV and a compound semiconductor material plate 82 including a compound semiconductor material. In one embodiment, the compound semiconductor material 82 may have a band gap energy in a range from 0.1 eV to 0.35 eV. In one embodiment, the high work function material comprises a material selected from a transparent conductive oxide, ruthenium, rhodium, cobalt, gold, palladium, nickel, iridium, or platinum; and the compound semiconductor material 82 comprises a material selected from indium antimonide, indium arsenide, lead telluride, or bismuth telluride.

According to another aspect of the present disclosure, a semiconductor structure is provided, which comprises: an energy harvesting device 80 comprising a Schottky barrier diode 83, a first diode electrode 84 located on a first side of the Schottky barrier diode 83, and a second diode electrode (comprising a common electrode 28) connected to a second side of the Schottky barrier diode 83; and a battery structure 20 underlying the energy harvesting device and comprising an energy storage medium, a first battery electrode that is the same as the second diode electrode of the Schottky barrier diode 83, and a second battery electrode 18.

In one embodiment, the energy harvesting device 80 and the energy storage medium 22 may have a same shape and a same size in a plan view along a vertical direction. In one embodiment, the Schottky barrier diode 83 comprises a Schottky barrier junction located at an interface between a high work function plate including a high work function material having a work function greater than 4.5 eV and a compound semiconductor material plate 82 including a compound semiconductor material; and the high work function plate may have openings therethrough and the compound semiconductor material plate 82 has a greater area than the high work function plate. In one embodiment, the Schottky barrier diode 83 comprises a Schottky barrier junction located at an interface between a high work function plate including a high work function material having a work function greater than 4.5 eV and a compound semiconductor material plate 82 including a compound semiconductor material; and the Schottky barrier has a vertical undulation in a vertical cross-sectional profile such that raised portions of the Schottky barrier are interlaced with recessed portions of the Schottky barrier. In one embodiment, the semiconductor structure may further include semiconductor devices 701 located on a substrate 8; and metal interconnect structures (612, 618, 622, 628, 632, 638, 642, 648) that are located within dielectric material layers (601, 610, 620, 630, 640) overlying the semiconductor devices 701 and electrically connecting the first diode electrode to a first node of the semiconductor devices 701 and the second battery electrode 18 to a second node of the semiconductor devices 701.

Generally, the device of the present disclosure allows harvesting of thermal radiation from semiconductor devices during operation of high performance CMOS IC devices, and further allows storage of the captured energy in the form of electrical energy in an energy storage medium 22. The device of the present disclosure may be integrated into CMOS IC devices using three-dimensional integrated circuit fabrication processes, silicon backend processes, or far backend processes. Generally, the processing steps of the present disclosure are compatible with semiconductor processing steps used in the microelectronics industry, and provides energy recycling and storage of the recycled energy.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   semiconductor devices located on a substrate;
   metal interconnect structures that are located within dielectric material layers overlying the semiconductor devices and are electrically connected to the semiconductor devices;
   an energy harvesting device located over the metal interconnect structures and comprising a Schottky barrier diode, wherein the Schottky barrier diode comprises a first diode electrode located on a first side of the Schottky barrier diode, and a second diode electrode connected to a second side of the Schottky barrier diode; and
   a battery structure overlying the metal interconnect structures and comprising:
       an energy storage medium;
       a first battery electrode that is the second diode electrode of the Schottky barrier diode; and
       a second battery electrode.

2. The semiconductor structure of claim 1, wherein:
   the first diode electrode of the Schottky barrier diode is electrically connected to a first metal interconnect structure selected from the metal interconnect structures; and
   the second battery electrode of the battery structure is electrically connected to a second metal interconnect structure selected from the metal interconnect structures.

3. The semiconductor structure of claim 1, wherein the energy storage medium comprises an ionic crystal plate including an ionic crystal having ionic conductivity greater than $1.0 \times 10^{-5}$ S/cm in a temperature range from $-40$ degrees Celsius to 125 degrees Celsius.

4. The semiconductor structure of claim 3, wherein the battery structure comprises a blocking dielectric layer comprising a dielectric metal oxide material and located between the ionic crystal plate and the first diode electrode.

5. The semiconductor structure of claim 4, wherein the battery structure comprises conductive metal oxide layer located between the blocking dielectric layer and the first battery electrode.

6. The semiconductor structure of claim 1, wherein the first battery electrode comprises a metallic material including at least one transition metal or a conductive metal oxide material.

7. The semiconductor structure of claim 1, wherein the Schottky barrier diode comprises a Schottky barrier junction located at an interface between a high work function plate including a high work function material having a work function greater than 4.5 eV and a compound semiconductor material plate including a compound semiconductor material.

8. The semiconductor structure of claim 7, wherein the compound semiconductor material has a band gap energy in a range from 0.1 eV to 0.35 eV.

9. The semiconductor structure of claim 8, wherein:
the high work function material comprises a material selected from a transparent conductive oxide, ruthenium, rhodium, cobalt, gold, palladium, nickel, iridium, or platinum; and
the compound semiconductor material comprises a material selected from indium antimonide, indium arsenide, lead telluride, or bismuth telluride.

10. A semiconductor structure comprising:
an energy harvesting device comprising:
a Schottky barrier diode;
a first diode electrode located on a first side of the Schottky barrier diode; and
a second diode electrode connected to a second side of the Schottky barrier diode; and
a battery structure underlying the energy harvesting device and comprising:
an energy storage medium;
a first battery electrode that is the second diode electrode of the Schottky barrier diode; and
a second battery electrode,
wherein the semiconductor structure further comprises:
semiconductor devices located on a substrate; and
metal interconnect structures that are located within dielectric material layers overlying the semiconductor devices and electrically connecting the first diode electrode to a first node of the semiconductor devices and the second battery electrode to a second node of the semiconductor devices.

11. The semiconductor structure of claim 10, wherein the energy harvesting device and the energy storage medium have a same shape and a same size in a plan view along a vertical direction.

12. The semiconductor structure of claim 10, wherein:
the Schottky barrier diode comprises a Schottky barrier junction located at an interface between a high work function plate including a high work function material having a work function greater than 4.5 eV and a compound semiconductor material plate including a compound semiconductor material; and
the high work function plate has openings therethrough and the compound semiconductor material plate has a greater area than the high work function plate.

13. The semiconductor structure of claim 10, wherein:
the Schottky barrier diode comprises a Schottky barrier junction located at an interface between a high work function plate including a high work function material having a work function greater than 4.5 eV and a compound semiconductor material plate including a compound semiconductor material; and
the Schottky barrier junction has a vertical undulation in a vertical cross-sectional profile such that raised portions of the Schottky barrier junction are interlaced with recessed portions of the Schottky barrier junction.

14. The semiconductor structure of claim 11, wherein the energy storage medium comprises an ionic crystal plate including an ionic crystal having ionic conductivity greater than $1.0 \times 10^{-5}$ S/cm in a temperature range from −40 degrees Celsius to 125 degrees Celsius.

15. The semiconductor structure of claim 14, wherein the battery structure comprises a blocking dielectric layer comprising a dielectric metal oxide material and located between the ionic crystal plate and the first diode electrode.

16. A method of forming a semiconductor structure, the method comprising:
forming semiconductor devices on a substrate;
forming metal interconnect structures and dielectric material layers over the semiconductor devices, wherein the metal interconnect structures are electrically connected to the semiconductor devices, and are formed in the dielectric material layers;
forming a battery structure over the metal interconnect structures, wherein the battery structure comprises an energy storage medium, a first battery electrode that is the second diode electrode of the Schottky barrier diode, and a second battery electrode; and
forming an energy harvesting device over the metal interconnect structures and over the battery structure, wherein the energy harvesting device comprises a Schottky barrier diode, a first diode electrode located on a first side of the Schottky barrier diode, and a second diode electrode connected to a second side of the Schottky barrier diode.

17. The method of claim 16, wherein:
the second battery electrode is formed on one of the metal interconnect structures; and
the method further comprises forming additional metal interconnect structures electrically connecting the first diode electrode to one of the metal interconnect structures.

18. The method of claim 16, wherein the energy storage medium is formed by depositing and patterning an ionic crystal having ionic conductivity greater than $1.0 \times 10^{-5}$ S/cm in a temperature range from −40 degrees Celsius to 125 degrees Celsius.

19. The method of claim 16, wherein:
the Schottky barrier diode is formed by depositing and patterning a layer stack that includes a compound semiconductor material layer and a high work function material layer;
the high work function material layer comprises high work function material having a work function greater than 4.5 eV; and
the compound semiconductor material layer comprises a compound semiconductor material having a band gap energy in a range from 0.1 eV to 0.35 eV.

20. The method of claim 16, wherein:
the first diode electrode of the Schottky barrier diode is electrically connected to a first metal interconnect structure selected from the metal interconnect structures through a subset of additional metal interconnect structures that are formed after formation of the energy harvesting device; and
the second battery electrode of the battery structure is formed directly on a second metal interconnect structure selected from the metal interconnect structures.

* * * * *